(12) United States Patent
Hu et al.

(10) Patent No.: US 9,548,332 B2
(45) Date of Patent: *Jan. 17, 2017

(54) METHOD OF FORMING A MICRO LED DEVICE WITH SELF-ALIGNED METALLIZATION STACK

(75) Inventors: Hsin-Hua Hu, Los Altos, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 480 days.

This patent is subject to a terminal disclaimer.

(21) Appl. No.: 13/458,932

(22) Filed: Apr. 27, 2012

(65) Prior Publication Data

US 2013/0285086 A1    Oct. 31, 2013

(51) Int. Cl.
| | | |
|---|---|---|
| H01L 33/60 | (2010.01) | |
| H01L 27/15 | (2006.01) | |
| H01L 23/00 | (2006.01) | |
| H01L 25/075 | (2006.01) | |
| H01L 33/00 | (2010.01) | |
| H01L 33/20 | (2010.01) | |
| H01L 33/40 | (2010.01) | |
| H01L 33/44 | (2010.01) | |

(52) U.S. Cl.
CPC .............. *H01L 27/156* (2013.01); *H01L 24/75* (2013.01); *H01L 24/83* (2013.01); *H01L 24/95* (2013.01); *H01L 25/0753* (2013.01); *H01L 33/0079* (2013.01); *H01L 33/0095* (2013.01); *H01L 33/20* (2013.01); *H01L 33/405* (2013.01); *H01L 33/44* (2013.01); *H01L 2224/7598* (2013.01); *H01L 2224/95* (2013.01); *H01L 2924/12041* (2013.01); *H01L 2924/12042* (2013.01)

(58) Field of Classification Search
CPC .............. H01L 27/156; H01L 25/0753; H01L 33/0079; H01L 2224/95; H01L 33/405; H01L 33/44; H01L 33/20
USPC ........... 257/98, E33.06, E33.066; 438/29, 34
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |
| 5,435,857 A | 7/1995 | Han et al. |

(Continued)

FOREIGN PATENT DOCUMENTS

| | | |
|---|---|---|
| CN | 101103499 | 1/2008 |
| DE | 101 24 328 A1 | 11/2002 |

(Continued)

OTHER PUBLICATIONS

PCT International Search Report and Written Opinion for International Application No. PCT/US2013/036477, mailed Jul. 26, 2013, 9 pages.

(Continued)

*Primary Examiner* — Hrayr A Sayadian
(74) *Attorney, Agent, or Firm* — Blakely, Sokoloff, Taylor & Zafman LLP

(57) ABSTRACT

A method of fabricating and transferring a micro device and an array of micro devices to a receiving substrate are described. In an embodiment, a patterned sacrificial layer is utilized to form a self-aligned metallization stack and is utilized as an etch stop layer during etching of a p-n diode layer to form a plurality of micro p-n diodes.

26 Claims, 32 Drawing Sheets

(56) References Cited

U.S. PATENT DOCUMENTS

| | | |
|---|---|---|
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,319,778 B1 | 11/2001 | Chen et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,586,875 B1 | 7/2003 | Chen et al. |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,762,069 B2 | 7/2004 | Huang et al. |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,015,513 B2 | 3/2006 | Hsieh |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,560,738 B2 | 7/2009 | Liu |
| 7,585,703 B2 | 9/2009 | Matsumura et al. |
| 7,622,367 B1 | 11/2009 | Nuzzo et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,732,301 B1 | 6/2010 | Pinnington et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 * | 4/2013 | Bibl et al. .................... 438/27 |
| 8,440,546 B2 | 5/2013 | Nuzzo et al. |
| 8,506,867 B2 | 8/2013 | Menard |
| 8,518,204 B2 | 8/2013 | Hu et al. |
| 8,552,436 B2 | 10/2013 | Bibl et al. |
| 8,558,243 B2 | 10/2013 | Bibl et al. |
| 8,573,469 B2 * | 11/2013 | Hu et al. .................... 228/179.1 |
| 8,646,505 B2 | 2/2014 | Bibl et al. |
| 8,664,699 B2 | 3/2014 | Nuzzo et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2005/0253156 A1 | 11/2005 | Horio et al. |
| 2005/0253161 A1 | 11/2005 | Horio et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0154390 A1 | 7/2006 | Tran et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 | 12/2007 | Slater et al. |
| 2008/0035949 A1 | 2/2008 | Fudeta et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0237629 A1 | 10/2008 | Ando et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2008/0315236 A1 | 12/2008 | Lu et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0242918 A1 | 10/2009 | Edmond et al. |
| 2009/0278233 A1 | 11/2009 | Pinnington et al. |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0171094 A1 | 7/2010 | Lu et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0244077 A1 | 9/2010 | Yao |
| 2010/0248484 A1 | 9/2010 | Bower et al. |
| 2010/0276726 A1 | 11/2010 | Cho et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0215292 A1 | 9/2011 | Zaima et al. |
| 2011/0244611 A1 | 10/2011 | Kim |
| 2011/0291134 A1 | 12/2011 | Kang |
| 2011/0297914 A1 | 12/2011 | Zheng et al. |
| 2011/0297972 A1 | 12/2011 | Seo et al. |
| 2011/0312131 A1 | 12/2011 | Renavikar et al. |
| 2012/0018470 A1 | 1/2012 | Jang et al. |
| 2012/0027557 A1 | 2/2012 | Ashdown et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0126098 A1 | 5/2013 | Bibl et al. |
| 2013/0130440 A1 | 5/2013 | Hu et al. |

(56) References Cited

U.S. PATENT DOCUMENTS

| | | | |
|---|---|---|---|
| 2013/0134591 A1 | 5/2013 | Sakamoto et al. | |
| 2013/0161682 A1 | 6/2013 | Liang et al. | |
| 2014/0373898 A1 | 12/2014 | Rogers et al. | |

FOREIGN PATENT DOCUMENTS

| | | |
|---|---|---|
| JP | 05-013820 A | 1/1993 |
| JP | 07-060675 A | 3/1995 |
| JP | 61-102787 | 5/1996 |
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2004-111680 | 4/2004 |
| JP | 2005-322847 A | 11/2005 |
| JP | 2008-200821 A | 9/2008 |
| JP | 2008-235362 A | 10/2008 |
| JP | 2009-054897 A | 3/2009 |
| JP | 2010-056458 A | 3/2010 |
| JP | 2010-087515 A | 4/2010 |
| JP | 2010-123843 | 6/2010 |
| JP | 2010-161212 A | 7/2010 |
| JP | 2010-186829 A | 8/2010 |
| JP | 2011-181834 A | 9/2011 |
| KR | 10-2002-0005152 | 1/2002 |
| KR | 10-2002-0069357 | 8/2002 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 01/41219 A | 6/2001 |
| WO | WO 2005-099310 A2 | 10/2005 |
| WO | WO 2010-065070 A2 | 6/2010 |
| WO | WO 2011/072372 A1 | 6/2011 |
| WO | WO 2011/123285 | 10/2011 |
| WO | WO 2013/109593 | 7/2013 |

OTHER PUBLICATIONS

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.

LuxVue Technology Corporation Office Action for U.S. Appl. No. 13/372,310 mailed May 1, 2012.

PCT International Preliminary Report on Patentability for International Application No. PCT/US2013/036477, mailed Nov. 6, 2014, 6 pages.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID Oct. 8-12, 2006, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

English machine translation of Unexamined Publication No. KR 10-2002-0005152 published Jan. 17, 2002, translation received Nov. 5, 2016, 9 pages.

* cited by examiner

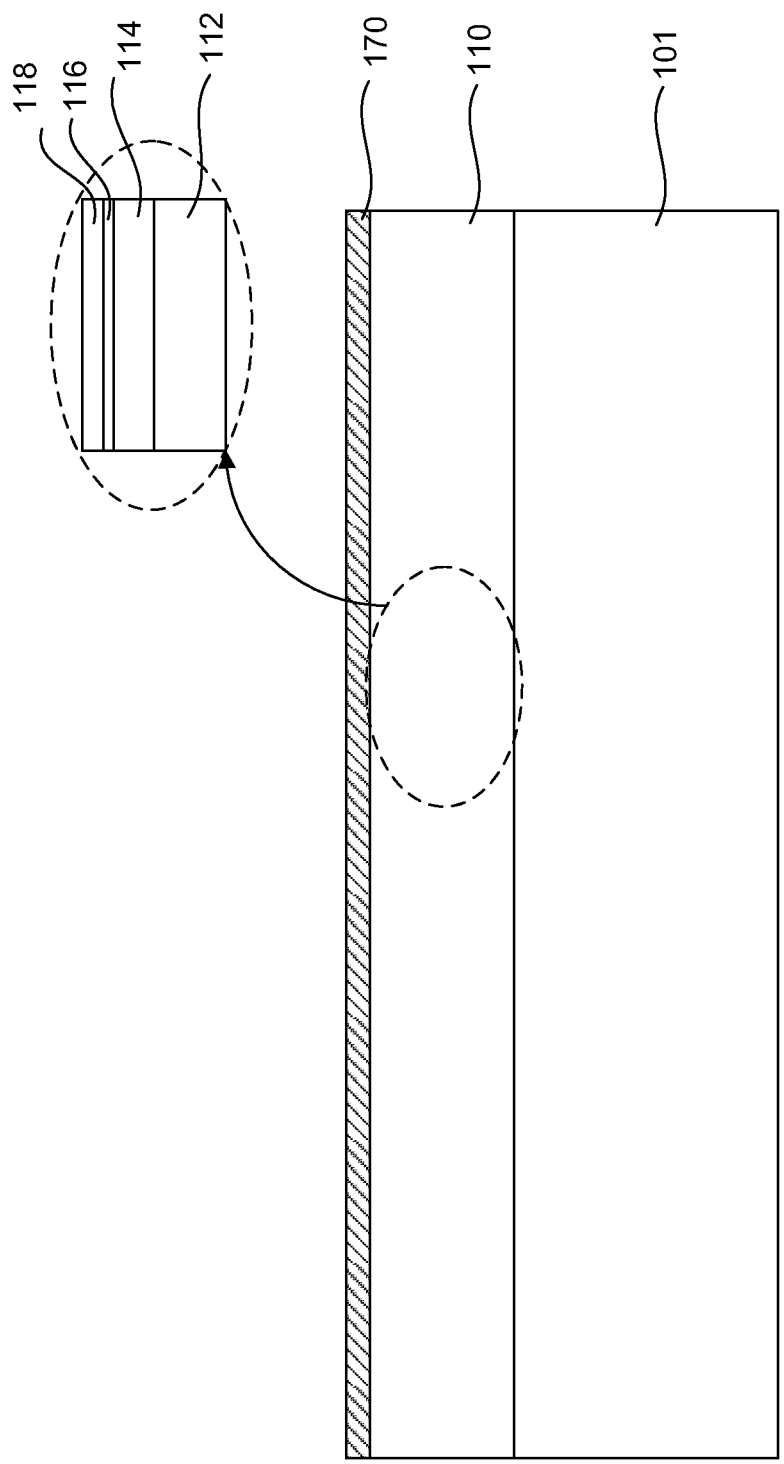

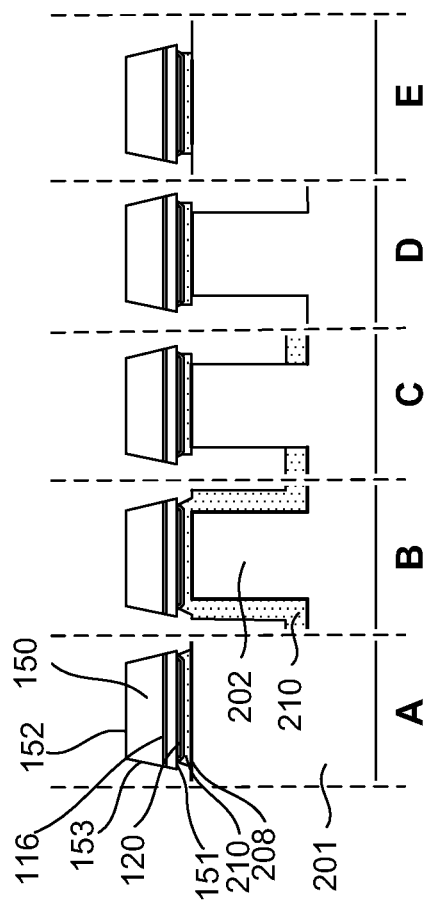

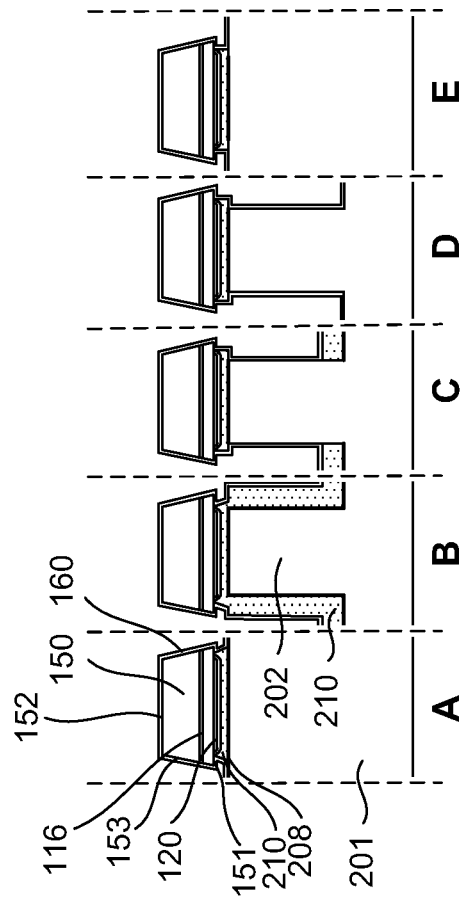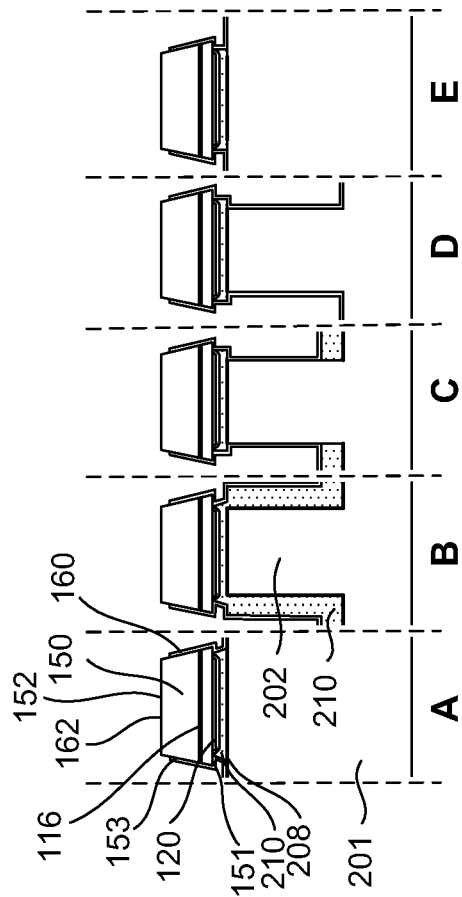

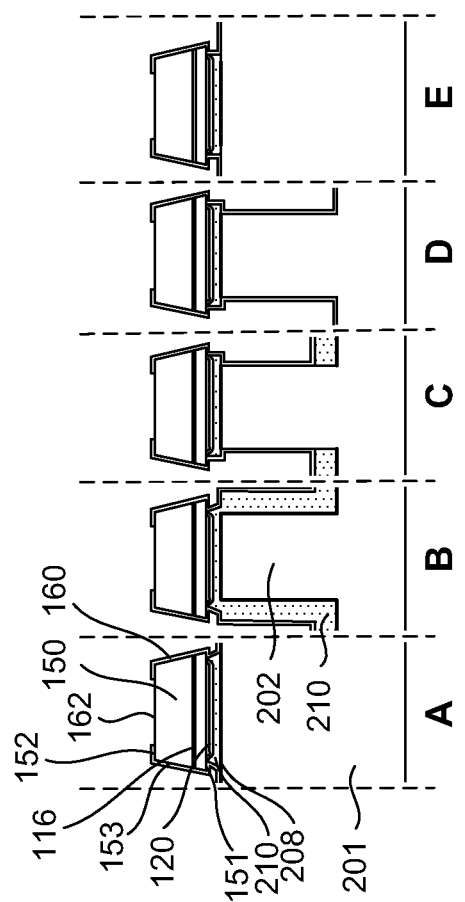

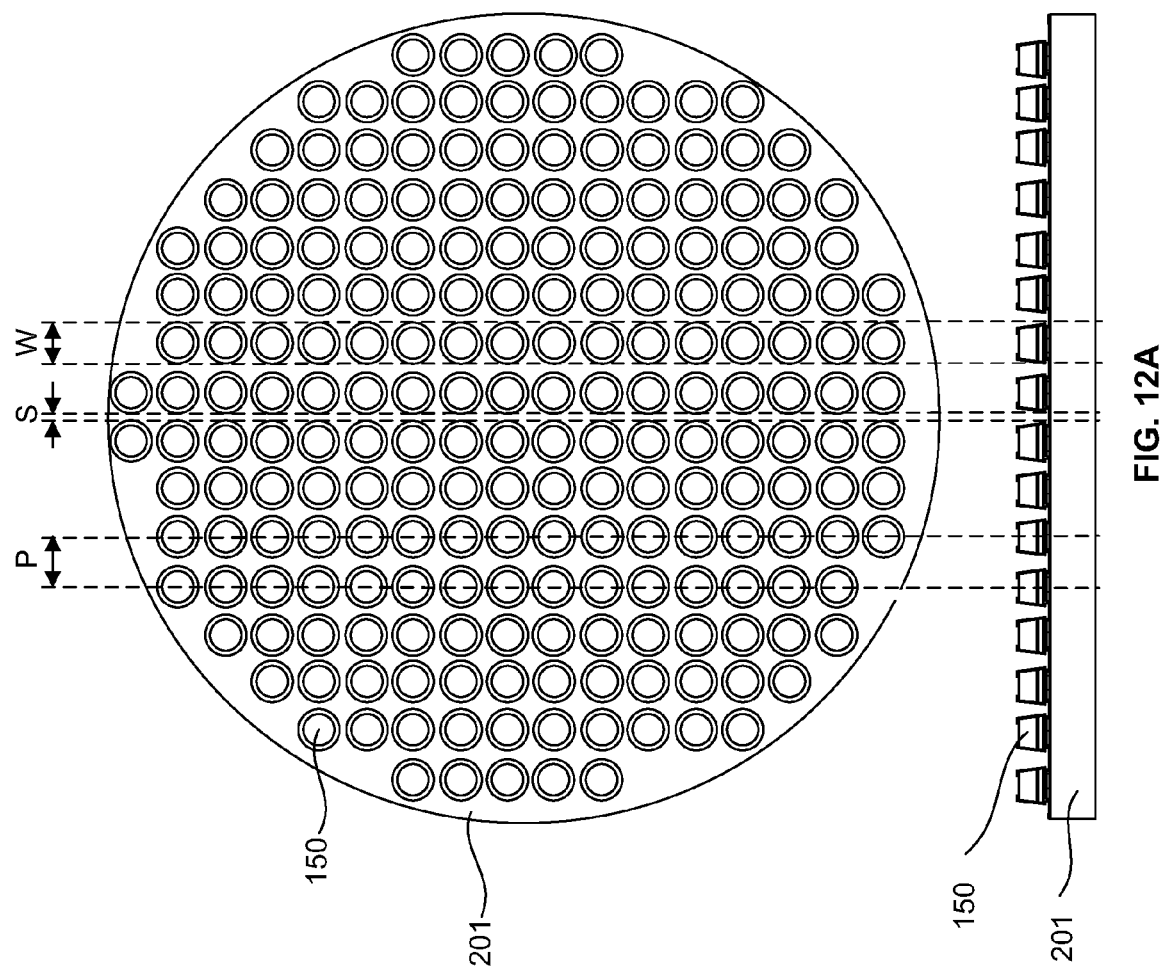

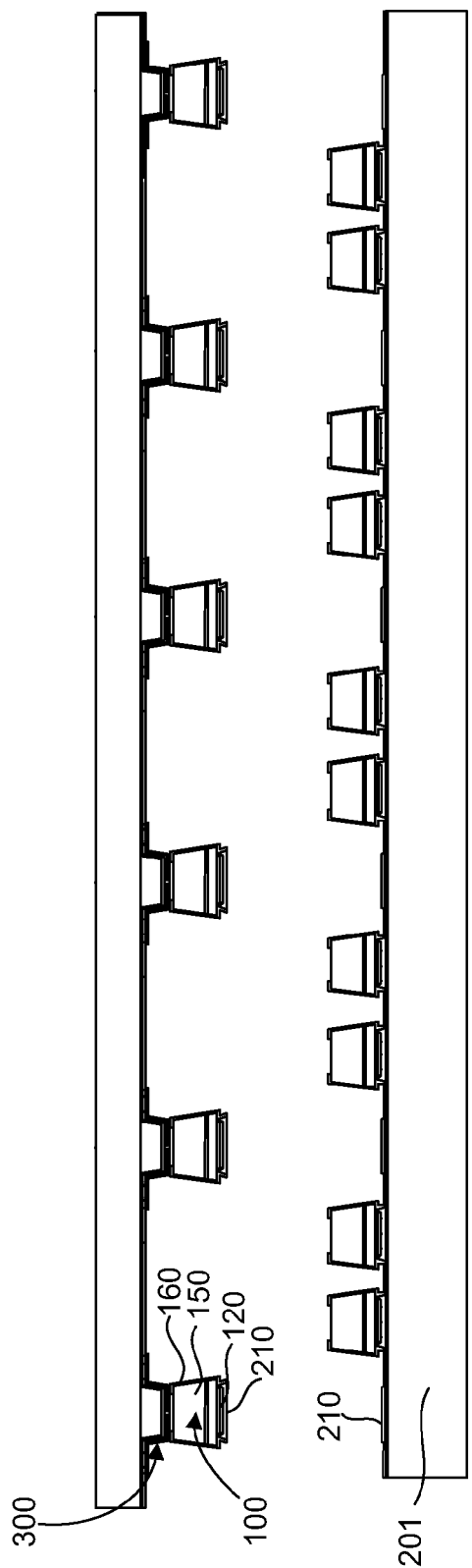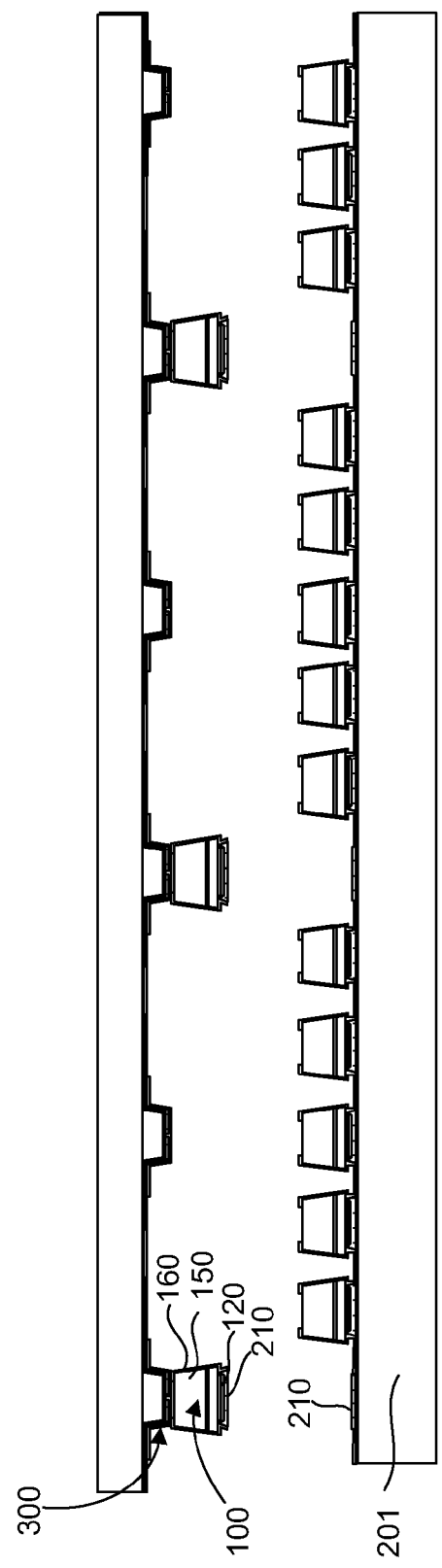

METHOD OF FORMING A MICRO LED DEVICE WITH SELF-ALIGNED METALLIZATION STACK

BACKGROUND

Field

The present invention relates to micro devices. More particularly embodiments of the present invention relate to a method of forming an array of micro devices such as light emitting diodes (LEDs) and transferring to a different substrate.

vBackground Information

Light emitting diodes (LEDs) based upon gallium nitride (GaN) are expected to be used in future high-efficiency lighting applications, replacing incandescent and fluorescent lighting lamps. Current GaN-based LED devices are prepared by heteroepitaxial growth techniques on foreign substrate materials. A typical wafer level LED device structure may include a lower n-doped GaN layer formed over a sapphire growth substrate, a single quantum well (SQW) or multiple quantum well (MWQ), and an upper p-doped GaN layer.

In one implementation, the wafer level LED device structure is patterned into an array of mesas on the sapphire growth substrate by etching through the upper p-doped GaN layer, quantum well layer, and into the n-doped GaN layer. An upper p-electrode is formed on the top p-doped GaN surfaces of the array of mesas, and an n-electrode is formed on a portion of the n-doped GaN layer which is in contact with the array of mesas. The mesa LED devices remain on the sapphire growth substrate in the final product.

In another implementation, the wafer level LED device structure is transferred from the growth substrate to an acceptor substrate such as silicon, which has the advantage of being more easily diced to form individual chips than a GaN/sapphire composite structure. In this implementation, the wafer level LED device structure is permanently bonded to the acceptor (silicon) substrate with a permanent bonding layer. For example, the p-electrode formed on the p-doped GaN surfaces of the array of mesas can be bonded to the acceptor (silicon) substrate with a permanent bonding layer. The sapphire growth substrate is then removed to expose the inverted wafer level LED device structure, which is then thinned to expose the array of mesas. N-contacts are then made with the exposed n-doped GaN, and p-contacts are made on the silicon surface which is in electrical contact with the p-electrode. The mesa LED devices remain on the acceptor substrate in the final product. The GaN/silicon composite can also be diced to form individual chips.

SUMMARY OF THE INVENTION

A micro light emitting diode (LED) and a method of forming an array of micro LEDs for transfer to a receiving substrate are described. For example, the receiving substrate may be, but is not limited to, a display substrate, a lighting substrate, a substrate with functional devices such as transistors or integrated circuits (ICs), or a substrate with metal redistribution lines. In an embodiment, a micro LED device includes a micro p-n diode and a metallization stack below a bottom surface of the micro p-n diode, in which the metallization stack includes an electrode layer on the bottom surface of the micro p-n diode and a barrier layer covering a bottom surface and sidewalls of the electrode layer. The bottom surface of the micro p-n diode may be wider than the metallization stack. A conformal dielectric barrier layer may span sidewalls of the micro p-n diode and partially span the bottom surface of the micro p-n diode. The metallization stack may be between the micro p-n diode and a bonding layer formed on a substrate. In an embodiment, the bonding layer has a liquidus temperature of approximately 350° C. or lower, and more specifically approximately 200° C. or lower. In an embodiment, the bonding layer is an alloy bonding layer.

In an embodiment, a method of forming a micro LED array includes forming a plurality of laterally separate self-aligned metallization stacks within a corresponding plurality of openings in a patterned sacrificial layer formed on a p-n diode layer. A first substrate stack including the plurality of separate self-aligned metallization stacks, the patterned sacrificial layer, and the p-n diode layer is bonded to a second substrate with a bonding layer. The p-n diode layer is etched through to form a plurality of micro p-n diodes over the plurality of separate metallization stack, and expose the patterned sacrificial layer laterally between the plurality of separate metallization stacks. The patterned sacrificial layer is then removed.

In an embodiment, forming the plurality of laterally separate self-aligned metallization stacks within the corresponding plurality of openings in the patterned sacrificial layer formed on the p-n diode layer includes depositing the sacrificial layer over the p-n diode layer, and forming a patterned mask layer over the sacrificial layer where the patterned mask layer includes the plurality of openings exposing the sacrificial layer. The sacrificial layer is then selectively etched relative to the mask layer to remove the exposed sacrificial layer within the plurality of openings and to remove a portion of the sacrificial layer underneath the patterned mask layer. A metallization stack layer is then deposited over the patterned mask layer and the p-n diode layer. The patterned mask layer may then be lifted off utilizing a lift-off technique leaving behind a plurality of metallization stacks and the patterned sacrificial layer over the p-n diode layer.

In an embodiment, the first substrate stack is bonded to the second substrate with a bonding layer having a liquidus temperature of approximately 350° C. or lower, or more specifically approximately 200° C. or lower. For example, the bonding layer may include indium (In). In an embodiment, a first bonding layer on the first substrate stack is bonded with a bonding layer on the second substrate. For example, bonding may include alloy bonding where the first and second bonding layers are formed of different materials, or fusion bonding where the first and second bonding layers are formed of the same material.

In an embodiment, the plurality of self-aligned metallization stacks include an electrode layer and a barrier layer. The barrier layer may cover an elevated surface and sidewalls of the electrode layer, which may also be reflective. For example, the electrode layer can include a material selected from the group of silver and nickel, which is reflective to the visible spectrum. In one embodiment, the barrier layer can be formed to cover the elevated surface and sidewalls of the electrode layer by depositing the barrier layer at a higher power and/or lower pressure than the electrode layer. For example, when depositing utilizing an evaporation or sputtering technique a higher power and/or lower pressure allows for further migration of the deposited material underneath a patterned mask layer and enables the deposited barrier layer to cover sidewalls of the electrode layer.

In an embodiment, the patterned sacrificial layer is thicker than the plurality of laterally separate self-aligned metallization stacks. For example, the patterned sacrificial layer may be approximately twice as thick as the plurality of laterally self-aligned metallization stacks. The patterned sacrificial layer may also be formed from a non-metallic material, such as silicon dioxide ($SiO_2$). The non-metallic material may possess different etching characteristics than the p-n diode layer. In an embodiment, the p-n diode layer is plasma etched to form the plurality of micro p-n diodes, and the sacrificial layer acts an etch stop layer. Removal of the sacrificial layer may result in exposing a portion of a bottom surface of the micro p-n diodes. In an embodiment, a conformal dielectric barrier layer is then deposited on side surfaces and a portion of the bottom surface of each of the plurality of micro p-n diodes.

In an embodiment, a method of transferring one or more micro LEDs to a receiving substrate includes positioning a transfer head over a carrier substrate having an array of micro LED devices disposed thereon. Each micro LED device includes a micro p-n diode, a reflective metallization stack between the micro p-n diode and a bonding layer on the carrier substrate. An operation is performed to create a phase change in the bonding layer for at least one of the micro LED devices. For example, the operation may include heating the bonding layer above a liquidus temperature of the bonding layer, with the liquidus temperature being 350° C. or lower, or more specifically 200° C. or lower. The bonding layer may also be an alloy bonding layer, such as an Ag—In alloy bonding layer, or a fusion bonded bonding layer, such as an In—In bonding layer.

The micro p-n diode and reflective metallization stack are picked up with a transfer head. In some embodiments, a substantial portion, such as approximately half a thickness of the bonding layer, is also picked up. In some embodiments a conformal dielectric barrier layer spanning sidewalls, and a portion of the bottom surface of the micro p-n diode is also picked up. The micro LED device which has been picked up with the transfer head is then placed onto a receiving substrate. The transfer head may operate in accordance with a variety of principles, including the transfer head exerting a pick up pressure on the micro LED device in accordance with electrostatic principles. Heat may also be applied to the bonding layer to create the phase change from a variety of sources, including local heat transfer, heat transfer through the carrier substrate, and heat transfer through the transfer head, and combinations thereof.

BRIEF DESCRIPTION OF THE DRAWINGS

FIG. 1A is a cross-sectional side view illustration of a sacrificial layer formed on a bulk LED substrate in accordance with an embodiment of the invention.

FIG. 8" is a cross-sectional side view illustration of etching a patterned sacrificial layer in accordance with an embodiment of the invention.

FIGS. 10-10" are cross-sectional side view illustrations of the formation of contact openings in a micro LED array in accordance with an embodiment of the invention.

FIGS. 12A-12B include top and cross-sectional side view illustrations of a carrier wafer and array of micro LED devices including micro p-n diodes in accordance with an embodiment of the invention.

FIG. 21A is a cross-sectional side view illustration of an array of micro device transfer heads picking up an array of micro LED devices in accordance with an embodiment of the invention.

FIG. 21B is a cross-sectional side view illustration of an array of micro device transfer heads picking up a portion of an array of micro LED devices in accordance with an embodiment of the invention.

DETAILED DESCRIPTION OF THE INVENTION

Figure 1B:
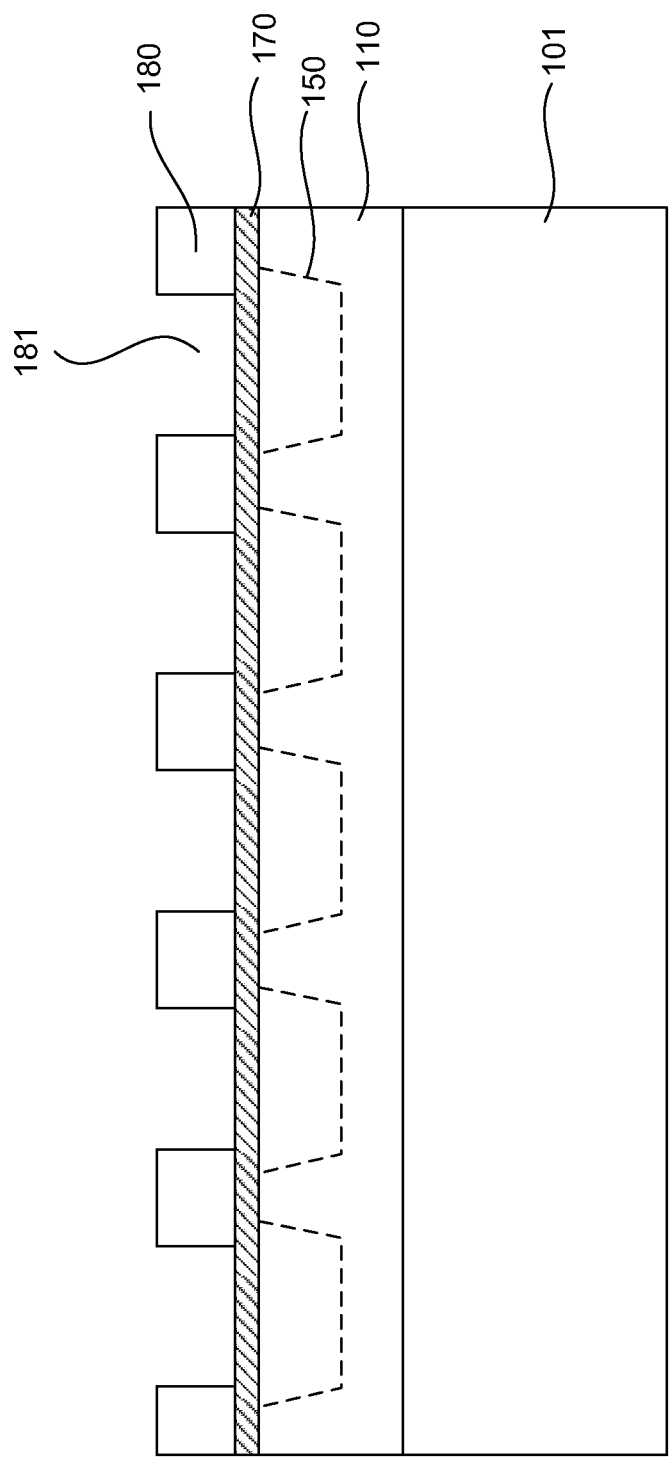
FIG. 1B is a cross-sectional side view illustration of a patterned mask layer in accordance with an embodiment of the invention.

Embodiments of the present invention describe micro devices and a method of forming an array of micro devices such as micro light emitting diodes (LEDs) for transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LEDs comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "spanning," "over," "to," "between" and "on" as used herein may refer to a relative position of one layer with respect to other layers. One layer "spanning," "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED device as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

In one aspect, embodiments of the invention describe a method of processing a bulk LED substrate into an array of micro LED devices which are poised for pick up and transfer to a receiving substrate. In this manner, it is possible to integrate and assemble micro LED devices into heterogeneously integrated systems. The micro LED devices can be picked up and transferred individually, in groups, or as the entire array. Thus, the micro LED devices in the array of micro LED devices are poised for pick up and transfer to a receiving substrate such as display substrate of any size ranging from micro displays to large area displays, and at high transfer rates. In some embodiments, arrays of micro LED devices which are poised for pick up are described as having a 10 µm by 10 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. Thus, a high density of pre-fabricated micro devices with a specific functionality may be produced in a manner in which they are poised for pick up and transfer to a receiving substrate. The techniques described herein are not limited to micro LED devices, and may also be used in the manufacture of other micro devices.

In another aspect, embodiments of the invention describe a manner of forming a micro LED array including a plurality of separate micro p-n diodes with self-aligned metallization stacks. In an embodiment, self-alignment may be accomplished by forming a patterned mask layer with a plurality of openings over a sacrificial layer, and removing the exposed sacrificial layer within the openings in the patterned mask layer as well as removing a portion of the sacrificial layer underneath the patterned mask layer laterally adjacent the plurality of openings, thereby undercutting the patterned mask layer. A metallization stack layer can then be deposited using a suitable technique such as evaporation and sputtering. The patterned mask layer and any portion of the metallization stack layer on the pattern mask layer can then be removed, for example utilizing a lift-off technique leaving behind the plurality of self-aligned metallization stacks. In this manner, the metallization stack layer may be discontinuous between the locations of the laterally separate metallization stacks, and regions where the metallization stack layer is formed on the patterned mask layer. This discontinuity may protect the laterally separate metallization stacks from peeling off during the lift-off operation. In an embodiment, the discontinuities may be the result of forming a patterned sacrificial layer which is thicker than the metallization stack layer.

In another aspect, embodiments of the invention describe a manner of forming a micro LED array in which the plurality of self-aligned metallization stacks include a barrier layer formed over an elevated surface and sidewalls of the electrode layer. As will become more apparent in the following description, the elevated surface may be an exposed top surface of the electrode layer when formed over a growth substrate, or a bottom surface of the electrode layer when incorporated into the micro LED device. In an embodiment, the electrode layer and barrier layer may be formed utilizing a suitable technique such as evaporation or sputtering. After depositing the electrode layer, the barrier layer may be deposited at a higher power and/or lower pressure than the electrode layer such that the barrier layer is deposited underneath the undercut patterned mask layer. Thus, by increasing the power or lowering the pressure in the chamber the deposited barrier layer may be wider than the deposited electrode layer, which enables the barrier layer to cover the sidewalls of the electrode layer. In some embodiments, the electrode layer includes a material which is susceptible to oxidation such as a silver (Ag) layer which may be incorporated into the electrode layer to function as a reflective mirror layer. In accordance with an embodiment of the invention, the barrier layer may protect the reflective mirror layer from oxidation which could potentially change color of the reflective mirror layer and affect the reflective properties of the reflective mirror layer.

In another aspect, embodiments of the invention describe a manner of forming a micro LED array for which the patterned sacrificial layer can be utilized to laterally separate a bonding layer into a plurality of laterally separate locations corresponding to the plurality of laterally separate micro p-n diodes. In an embodiment, a first substrate stack including the plurality of self-aligned metallization stacks, the patterned sacrificial layer, and the p-n diode layer is bonded to a second substrate with a bonding layer. The bonding layer may be a continuous bonding layer. In accordance with an embodiment of the invention, when bonding under heat and pressure the patterned sacrificial layer can be embossed into the bonding layer such that the bonding layer flows into reservoirs, or the plurality of openings within the patterned sacrificial layer including the plurality metallization stacks. In an embodiment, the patterned sacrificial layer is embossed completely through the bonding layer to make contact with the underlying second substrate thereby laterally separating the bonding layer into a plurality of laterally separate locations.

In another aspect, embodiments of the invention describe a manner of forming a micro LED device and array of micro LED devices in which the patterned sacrificial layer acts as an etch stop layer during etching of a p-n diode layer to form a plurality of micro p-n diodes. As a result, the patterned sacrificial layer can function to protect the sidewalls of the micro p-n diodes and a quantum well layer located within the micro p-n diodes from electrically conductive contamination which could degrade functionality of the micro LED devices. In an embodiment, the patterned sacrificial layer acts as a physical barrier to wicking of the bonding layer along the p-n diode layer during bonding of the growth substrate to the carrier substrate. In an embodiment, the electrically insulating layer acts as a physical barrier to the redistribution or re-sputtering of underlying electrically conductive layers such as an electrically conductive bonding layer during etching of the p-n diode layer to form the plurality of micro p-n diodes.

In another aspect, embodiments of the invention describe a manner of forming a micro LED device and array of micro LED devices in which a patterned sacrificial layer is removed to partially expose a bottom surface of a micro p-n diode, which allows the formation of a conformal dielectric barrier layer spanning both side surfaces of a micro p-n diode as well as partially span a bottom surface of the micro p-n diode. The conformal dielectric barrier layer may be cleaved at a natural break point after contacting the micro LED device with the transfer head and/or creating the phase change in the bonding layer during the pick up operation. In this manner, the portion of the conformal dielectric barrier layer wrapping underneath the micro p-n diode protects the conformal dielectric barrier layer on the sidewalls of the micro p-n diode from chipping or breaking during the pick up operation with the transfer head.

In accordance with the various aspects, embodiments of the invention described a manner of forming a micro LED device and array of micro LED devices in which a patterned sacrificial layer may be utilized to form self-aligned metallization stacks, which may include a barrier layer covering an electrode layer. The patterned sacrificial layer may also be utilized to protect the sidewalls of the micro LED devices from conductive contamination, such as during etching of the p-n diode layer. The patterned sacrificial layer may also be utilized to form a plurality of laterally separate locations of bonding layer. Additionally, the patterned sacrificial layer can be utilized to expose a bottom surface of the micro p-n diode for formation of a conformal dielectric barrier layer. As will become apparent in the following description, while each of the aforementioned aspects may be combined in a single embodiment, that embodiments of the invention are not so limited and that any aspect or combination of aspects may be combined or not combined in accordance with embodiments of the invention.

Referring now to FIG. 1A, a semiconductor device layer 110 may be formed on a substrate 101. In an embodiment, semiconductor device layer 110 may include one or more layers and is designed in such a way so as to perform in a controlled fashion a predetermined electronic function (e.g. diode, transistor, integrated circuit) or photonic function (LED, laser). It is to be appreciated that while semiconductor device layer 110 may be designed in such a way so as to perform in a controlled fashion in a predetermined function, that the semiconductor device layer 110 may not be fully functionalized. For example, contacts such as an anode or cathode may not yet be formed. In the interest of conciseness and to not obscure embodiments of the invention, the following description is made with regard to semiconductor device layer 110 as a p-n diode layer 110 grown on a growth substrate 101 in accordance with conventional heterogeneous growth conditions.

The p-n diode layer 110 may include a compound semiconductor having a bandgap corresponding to a specific region in the spectrum. For example, the p-n diode layer 110 may include one or more layers based on II-VI materials (e.g. ZnSe) or III-V materials including III-V nitride materials (e.g. GaN, AlN, InN, InGaN, and their alloys) and III-V phosphide materials (e.g. GaP, AlGaInP, and their alloys). Growth substrate 101 may include any suitable substrate such as, but not limited to, silicon, SiC, GaAs, GaN and sapphire ($Al_2O_3$).

In a particular embodiment, growth substrate 101 is sapphire, and the p-n diode layer 110 is formed of GaN. Despite the fact that sapphire has a larger lattice constant and thermal expansion coefficient mismatch with respect to GaN, sapphire is reasonably low cost, widely available and its transparency is compatible with excimer laser-based lift-off (LLO) techniques. In another embodiment, another material such as SiC may be used as the growth substrate 101 for a GaN p-n diode layer 110. Like sapphire, SiC substrates may be transparent. Several growth techniques may be used for growth of p-n diode layer 110 such as metalorganic chemical vapor deposition (MOCVD). GaN, for example, can be grown by simultaneously introducing trimethylgallium (TMGa) and ammonia ($NH_3$) precursors into a reaction chamber with the sapphire growth substrate 101 being heated to an elevated temperature such as 800° C. to 1,000° C. In the particular embodiment illustrated in FIG. 1A, p-n diode layer 110 may include a bulk GaN layer 112, an n-doped layer 114, a quantum well 116 and p-doped layer 118. The bulk GaN layer 112 may be n-doped due to silicon or oxygen contamination, or intentionally doped with a donor such as silicon. N-doped GaN layer 114 may likewise be doped with a donor such as silicon, while p-doped layer 118 may be doped with an acceptor such as magnesium. A variety of alternative p-n diode configurations may be utilized to form p-n diode layer 110. Likewise, a variety of single quantum well (SQW) or multiple quantum well (MQW) configurations may be utilized to form quantum well 116. In addition, various buffer layers may be included as appropriate. In one embodiment, the sapphire growth substrate 101 has a thickness of approximately 200 μm, bulk GaN layer 112 has a thickness of approximately 0.5 μm-5 μm, n-doped layer 114 has a thickness of approximately 0.1 μm-3 μm, quantum well layer 116 has a thickness less than approximately 0.3 μm and p-doped layer 118 has a thickness of approximately 0.1 μm-1 μm.

A sacrificial layer 170 may then be formed over the p-n diode layer 110. In an embodiment, the sacrificial layer 170 is formed of a non-metallic material that has different etching characteristics than the p-n diode layer 110. For example, sacrificial layer 170 may be a dielectric material such as, but not limited to, silicon dioxide ($SiO_2$), silicon nitride ($SiN_x$), phosphosilicate glass (PSG), and polyimide. In an embodiment, sacrificial layer 170 has a thickness of approximately 0.2 μm-4 μm. In an embodiment, sacrificial layer 170 is formed of $SiO_2$ with a thickness of approximately 0.5 μm.

Referring now to FIG. 1B, a patterned mask layer 180 is formed over sacrificial layer 170. For example, patterned mask layer 180 may be photoresist, though other materials may be used in which sacrificial layer 170 can be selectively etched relative to the patterned mask layer 180. Also illustrated as dotted lines in FIG. 1B are outlines where p-n diodes 150 will eventually be formed. As illustrated, the openings 181 in the patterned mask layer 180 have a smaller width than what will eventually be the bottom surface 151 of p-n diodes 150 (see, for example, FIGS. 11A-11B).

Figure 1C:
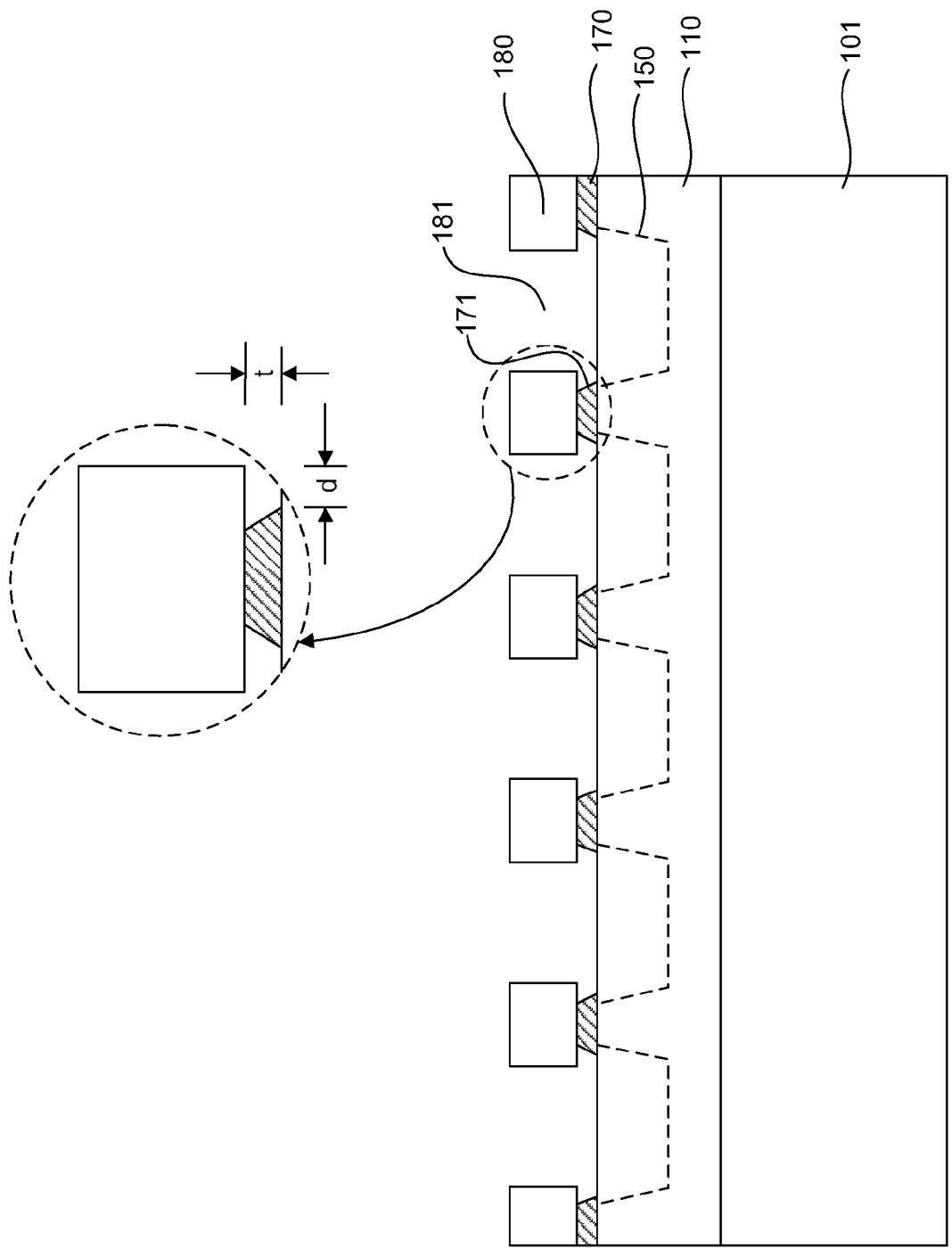
FIG. 1C is a cross-sectional side view illustration of a patterned sacrificial layer in accordance with an embodiment of the invention.

Referring now to FIG. 1C, the sacrificial layer 170 is selectively etched relative to the patterned mask layer to remove the exposed sacrificial layer 170 within the plurality of openings 181 and to remove a portion of the sacrificial layer underneath the patterned mask layer 180 adjacent the plurality of openings 181, thereby undercutting the patterned mask layer 180. In an embodiment, selective etching is performed with a suitable liquid etching solution. For example, where sacrificial layer 170 is formed of $SiO_2$, and patterned mask layer 180 is formed of photoresist, etching may be performed with buffered hydrofluoric acid (BHF). In the particular embodiment illustrated, wet etching may also produce tapered sidewalls 171. In the particular embodiment illustrated, the sacrificial layer 170 may undercut the patterned mask layer approximately the same distance (d) as the sacrificial layer is thick (t). As illustrated, the openings in the pattern sacrificial layer may have a smaller width than what will eventually be the bottom surface 151 of p-n diodes 150.

Figure 1D:
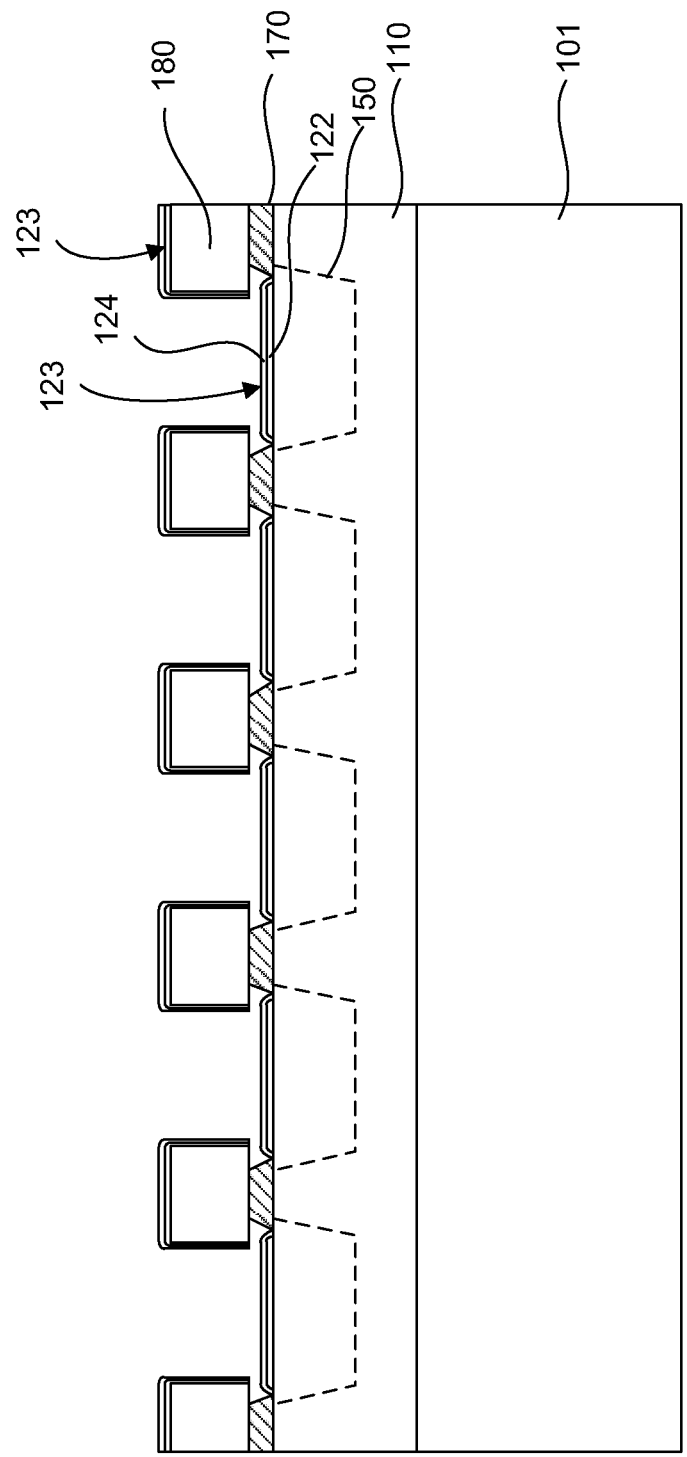
FIG. 1D is a cross-sectional side view illustration of deposited metallization stack layer in accordance with an embodiment of the invention.

A metallization stack layer 123 may then be deposited. As illustrated in FIG. 1D, metallization stack layer 123 may include an electrode layer 122 and optionally a barrier layer 124, though other layers may be included. Electrode layer 122 and barrier layer 124 may also include multiple layers. In an embodiment, reflective metallization stack layer has a thickness of approximately 0.1 μm-2 μm. In an embodiment, reflective metallization stack layer has a thickness of approximately 0.25 μm. Electrode layer 122 may make ohmic contact to the p-doped GaN layer 118, and may be formed of a high work-function metal such as Ni, Au, Ag, Pd and Pt. In an embodiment, electrode layer 122 may be reflective to light emission, and may function as a mirror reflecting light back toward the p-n diode layer 110. For example, an Ag or Ni layer may be included in the electrode layer 122 for its reflective properties. Electrode layers such as Ag may also be susceptible to oxidation. A barrier layer 124 may optionally be included in the reflective metallization stack layer 123 for a variety of reasons, including protecting the underlying electrode layer 122 from oxidation, and to prevent diffusion of impurities into the electrode layer 122 or p-n diode 110. For example, barrier layer 124 may include, but is not limited to, Pd, Pt, Ni, Ta, Ti and TiW. In certain embodiments, barrier layer 124 may prevent the diffusion of components from the bonding layer into the p-n diode layer 110. Barrier layer 124 may also prevent the diffusion of components, for example from bonding layers described below, into the electrode layer 122.

Figure 1E:
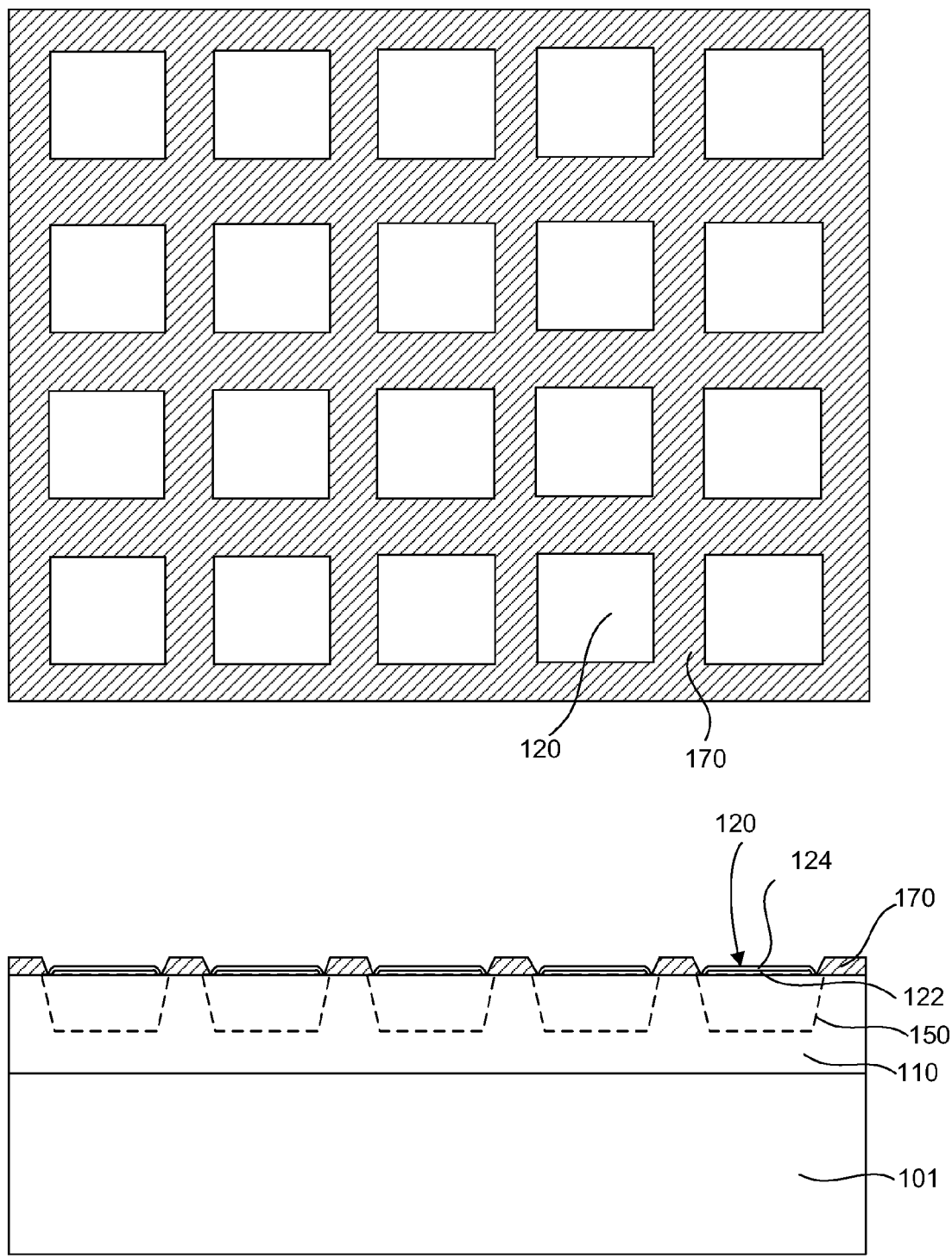
FIG. 1E includes top and cross-sectional side view illustrations of a patterned sacrificial layer laterally between a plurality of separate metallization stacks in accordance with an embodiment of the invention.

As illustrated in FIG. 1D, the patterned sacrificial layer 170 is thicker than metallization stack layer 123. In an embodiment, the patterned sacrificial layer is approximately twice as thick as the metallization stack layer 123 formed on the p-n diode layer 110. In an embodiment, the patterned sacrificial layer has a thickness of approximately 0.5 μm and the metallization stack layer 123 has a thickness of 0.25 μm on the p-n diode layer 110. Referring now to FIG. 1E in combination with FIG. 1D, the patterned mask layer 180 and any portion of the metallization stack layer 123 on the pattern mask layer 180 can then be removed, for example utilizing a lift-off technique leaving behind the plurality of self-aligned metallization stacks 120. In this manner, the metallization stack layer 123 may be discontinuous between the locations that will become laterally separate metallization stacks 120, and regions where the metallization stack layer 123 is formed on the patterned mask layer 180. This discontinuity protects the laterally separate metallization stacks 120 from peeling off during the lift-off operation. The discontinuities may be the result of forming a patterned sacrificial layer 180 which is thicker than the metallization stack layer 123.

Still referring to FIG. 1D, the electrode layer 122 and barrier layer 124 may be deposited utilizing a suitable technique such as evaporation and sputtering. As illustrated, the barrier layer 124 is formed over an elevated surface and sidewalls of the electrode layer 122. As will become more apparent in the following description, the elevated surface may be an exposed top surface of the electrode layer when formed over a growth substrate 101 as illustrated in FIG. 1D, or a bottom surface of the electrode layer 122 when incorporated into the micro LED device, as illustrated in exemplary FIGS. 11A-11B. The electrode layer is formed utilizing a suitable technique such as evaporation or sputtering. In an embodiment, the portion of electrode layer 122 formed on p-n diode layer 110 does not touch the sacrificial layer 170. For example, the electrode layer 122 may have a width between approximately the same width of opening 181 in patterned mask layer 180 and less than the width of the openings in patterned sacrificial layer 170. After depositing the electrode layer 122, the barrier layer 124 may be deposited utilizing the same technique at a higher power than the electrode layer 122 such that the barrier layer 124 is deposited further underneath the undercut patterned mask layer 180. Thus, by increasing the power the deposited barrier layer 124 may be wider than the deposited electrode layer 122, which enables the barrier layer 124 to cover the sidewalls of the electrode layer 122. A wider deposited barrier layer 124 may also be accomplished by depositing at a lower pressure than for the electrode layer 122, or a combination of lower pressure and higher power. In some embodiments, the electrode layer includes a material which is susceptible to oxidation such as a silver (Ag) layer which may be incorporated into the electrode layer 122 to function as a reflective mirror layer. In accordance with an embodiment of the invention, the barrier layer 124 may protect the reflective mirror layer (or other layer) from oxidation which could potentially change color of the reflective mirror layer and affect the reflective properties of the reflective mirror layer.

In certain embodiments, the pitch of the laterally separate reflective metallization stacks 120 may be 5 μm, 10 μm, or larger corresponding to the pitch of the array of micro LEDs 150. For example, a 5 μm pitch may be formed of 3 μm wide laterally separate reflective metallization stacks 120 separated by a 2 μm spacing. A 10 μm pitch may be formed of 8 μm wide separate reflective metallization stacks 120 separated by a 2 μm spacing. Though, these dimensions are meant to be exemplary and embodiments of the invention are not so limited. In some embodiments, the width of the laterally separate reflective metallization stacks 120 is less than or equal to the width of the bottom surface of the array of micro p-n diodes 150 as discussed in further detail in the following description and figures.

Figure 1F:
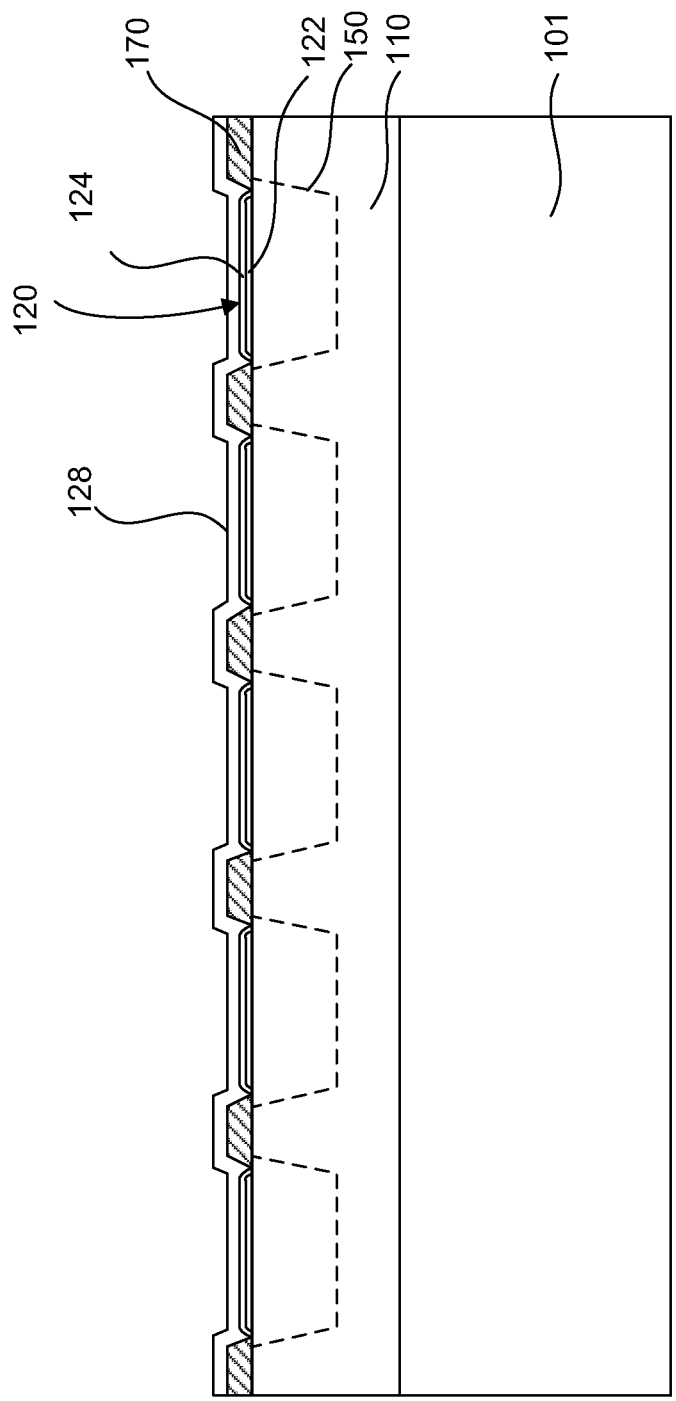
FIG. 1F is cross-sectional side view illustrations of a bonding layer formed over a patterned sacrificial layer laterally and plurality of separate metallization stacks in accordance with an embodiment of the invention.

In accordance with some embodiments, the growth substrate 101 stack illustrated in FIG. 1E is ready for bonding to a carrier substrate. For example the growth substrate 101 stack can be bonded to a carrier substrate 201 stack including a bonding layer 210 as described below with regard to FIGS. 2A-2E. In other embodiments, an additional layer or layers may be formed over the patterned sacrificial layer 170 and plurality of separate reflective metallization stacks 120. Referring to FIG. 1F, in an embodiment, a bonding layer 128 may optionally be formed of the substrate stack of FIG. 1E to facilitate bonding. The bonding layer 128 may be formed on any of the materials described with regard to Table 1 and Table 2 below, some of which may be dependent upon the composition of bonding layer 210, if present, for the formation of a fusion bonded layer or alloy bonding layer. For example, where bonding layer 128 is alloyed bonded with bonding layer 210, bonding layer 128 can be a pure metal, or metal alloy contributing to the chemical compositions provided in Table 1. In an embodiment the bonding layer 128 is electrically conductive and is approximately 500 to 2,000 angstroms thick. Prior to depositing the electrically conductive bonding layer 128, an adhesion layer may optionally be formed to increase adhesion of the electrically conductive bonding layer 128 to the patterned sacrificial layer 170 (e.g. SiO$_2$). For example, adhesion layer may be formed from Ti, TiW, Cr, or Ni, with a thickness of 100 to 1,000 angstroms, and more specifically approximately 300 angstroms or less. The bonding layer 128 and adhesion layer may optionally be patterned, for example to create openings at regions where the bonding layer 128 will not make contact with a corresponding bonding layer on a carrier substrate.

Figure 2A:
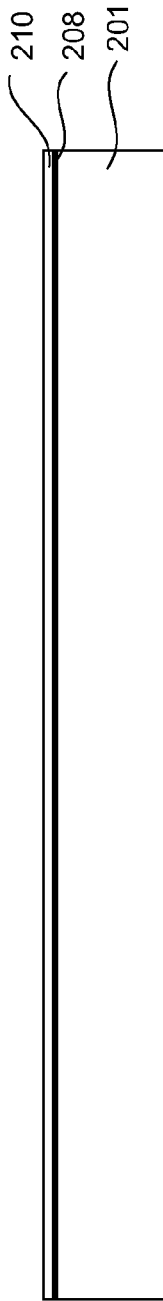
FIGS. 2A-2E are cross-sectional side view illustrations of a carrier substrate with bonding layer in accordance with an embodiment of the invention.
Figure 2B:
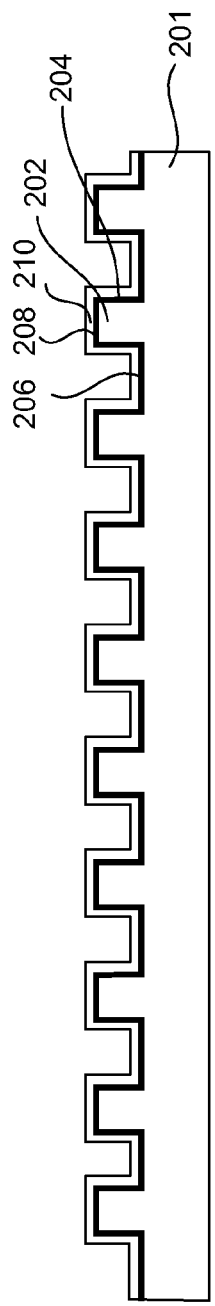
Figure 2C:
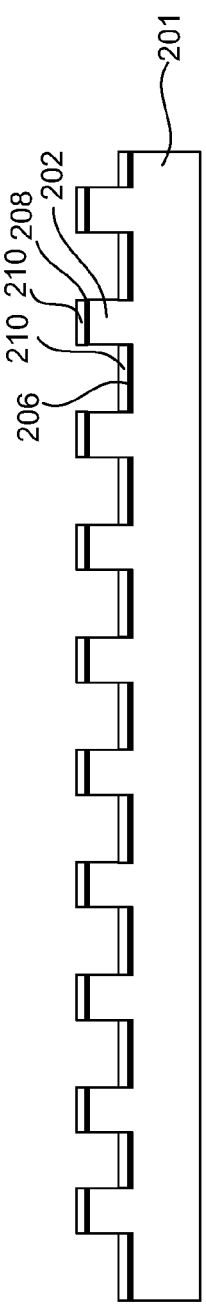
Figure 2D:
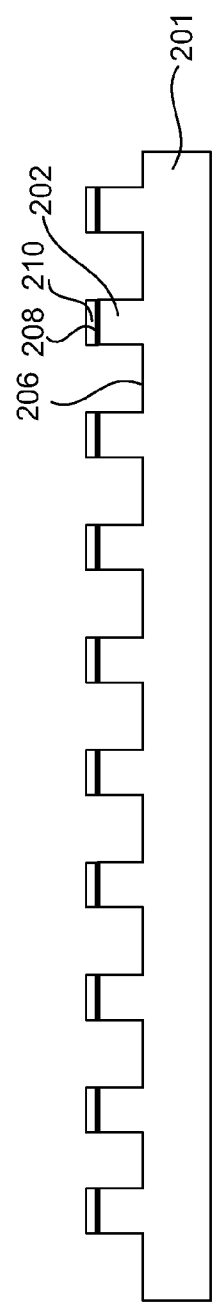

FIGS. 2A-2E are cross-sectional side view illustrations of various embodiments of a carrier substrate 201 with bonding layer 210 for bonding to the growth substrate 101 stack. The bonding layer 210 may be formed of any of the materials described with regard to Table 1 and Table 2 below, some of which may be dependent upon the composition of bonding layer 128, if present, for the formation of a fusion bonded layer or alloy bonding layer. For example, where bonding layer 210 is alloy bonded with bonding layer 128, bonding layer 210 can be a pure metal, or metal alloy contributing to the chemical compositions provided in Table 1. An adhesion layer 208 may optionally be formed prior to bonding layer 210. For example, adhesion layer 208 may be formed from Ti, TiW, Cr, or Ni, with a thickness of 100 to 1,000 angstroms, and more specifically approximately 300 angstroms or less. FIG. 2A illustrates a carrier substrate 201 and bonding layer 210 and adhesion layer 208 which are not patterned prior to bonding. FIGS. 2B-2D illustrate a carrier substrate 201 which has been patterned to form a plurality of posts 202 having sidewalls 204 and separated by trenches 206. Posts 202 may be formed from a variety of materials and techniques. In an embodiment, posts 202 may be formed integrally with carrier substrate 201 by patterning the carrier substrate 201 by an etching or embossing process. For example, carrier substrate 201 may be a silicon substrate with integrally formed posts 202. In another embodiment, posts can be formed on top of carrier substrate 201. For example, posts 202 may be formed by a plate up and photoresist lift off technique. Posts can be formed from any suitable material including semiconductors, metals, polymers, dielectrics, etc.

Posts 202 may have a maximum width which is equal to or less than a width of the micro p-n diodes 150, as will become more apparent in the following description and figures. In an embodiment, the trench posts 202 are at least twice as tall as a thickness of the bonding layer 210. In an embodiment, bonding layer 210 may have a thickness of approximately 0.1 μm-2 μm, and trench posts have a height of at least 0.2 μm-4 μm. In the particular embodiment illustrated in FIG. 2B, a conformal bonding layer 210 is formed over the posts 202, and on the sidewalls 204 and within trenches 206. In the particular embodiment illustrated in FIG. 2C, bonding layer 210 and adhesion layer 208 are anisotropically deposited so that they are formed only on the top surface of posts 202 and within the trenches 206, without a significant amount being deposited on the sidewalls 204. In the particular embodiment illustrated in FIG. 2D, bonding layer 210 and adhesion layer 208 are formed only on the top surface of posts 202. Such a configuration may be formed by patterning the posts 202, adhesion layer 208 and bonding layer 210 with the same patterned photoresist. In the particular embodiment illustrated in FIG. 2E, the laterally separate locations of the bonding layer 210 may be formed with a photoresist lift off technique in which blanket layers of the adhesion layer and bonding layer are deposited over a patterned photoresist layer, which is then lifted off (along with the portion of the adhesion layer and bonding layer on the photoresist layer) leaving behind the laterally separate locations of the bonding layer 210 illustrated in FIG. 2E, though other processing techniques may be used.

Figure 2E:
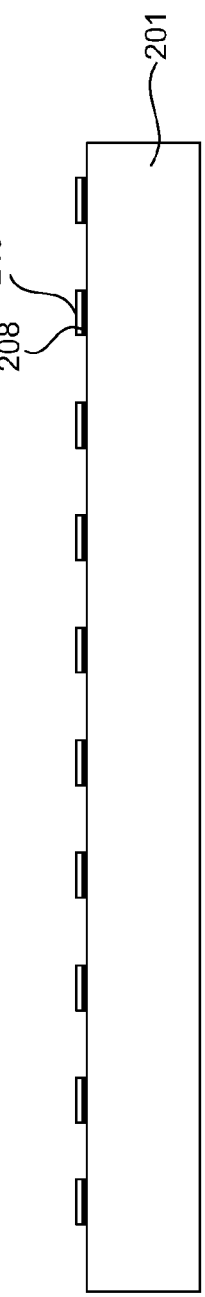

As described above with regard to FIGS. 2B-2E and FIGS. 1E-1F, certain embodiments of the invention include laterally separate reflective metallization stacks 120 and/or laterally separate locations of the bonding layers 128, 210. With regard to FIG. 2B, in which a conformal bonding layer 210 is formed over the posts 202, and on the sidewalls 204 and within trenches 206, the particular locations of the bonding layer on top of the posts 202 are laterally separated by the trenches 206. Thus, even though the conformal bonding layer 210 is continuous, the locations of the bonding layer 210 on top of the posts 202 are laterally separate locations. Likewise, the individual discrete locations of the bonding layer 210 in FIG. 2E are laterally separated by the space between them. Where posts 202 exist, the relationship of the bonding layer 210 thickness to post 202 height may factor into the lateral separation of the locations of the bonding layer 210.

The bonding layers 128 and 210 described above may be formed from a variety of suitable materials such as thermoplastic polymers, metals, and solders. The bonding layers as a single bonding layer or when bonded together through fusion bonding or alloy bonding may be capable of adhering a micro LED device to a carrier substrate. In an embodiment, the resultant bonding layer may have a liquidus temperature or melting temperature of approximately 350° C. or lower, or more specifically of approximately 200° C. or lower. At such temperatures the resultant bonding layer may undergo a phase change without substantially affecting the other components of the micro LED device. In an embodiment, the resultant bonding layer may be electrically conductive. For example, where the resultant bonding layer undergoes a phase change from solid to liquid in response to a change in temperature a portion of the resultant bonding layer may remain on the micro LED device during the pick up operation as described in more detail the following description. In such an embodiment, it may be beneficial that the resultant bonding layer is formed of an electrically conductive material so that it does not adversely affect the micro LED device when it is subsequently transferred to a receiving substrate. In this case, the portion of resultant bonding layer remaining on the micro LED device during the transfer operation may aid in bonding the micro LED device to an electrically conductive pad on the receiving substrate.

Solders may be suitable materials for bonding layers 128, 210 since many are generally ductile materials in their solid state and exhibit favorable wetting with semiconductor and metal surfaces. A typical alloy melts not a single temperature, but over a temperature range. Thus, solder alloys are often characterized by a liquidus temperature corresponding to the lowest temperature at which the alloy remains liquid, and a solidus temperature corresponding to the highest temperature at which the alloy remains solid. An exemplary list of low melting solder materials which may be utilized with embodiments of the invention are provided in Table 1, in which the chemical compositions are listed by weight percent of the components. As described above, where bonding layers 128, 210 are bonded together to form an alloy bonding layer, the bonding layers 128, 210 can be a pure metal, or metal alloy contributing to the chemical compositions provided in Table 1.

TABLE 1

| Chemical composition (weight %) | Liquidus Temperature (° C.) | Solidus Temperature (° C.) |
|---|---|---|
| 100In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 90In10Sn | 151 | 143 |
| 48In52Sn | 118 | 118 |
| 50In50Sn | 125 | 118 |
| 52Sn48In | 131 | 118 |
| 58Sn42In | 145 | 118 |
| 97In3Ag | 143 | 143 |
| 94.5In5.5Ag | 200 | — |
| 99.5In0.5Au | 200 | — |
| 95In5Bi | 150 | 125 |
| 99.3In0.7Ga | 150 | 150 |
| 99.4In0.6Ga | 152 | 152 |
| 99.6In0.4Ga | 153 | 153 |
| 99.5In0.5Ga | 154 | 154 |
| 58Bi42Sn | 138 | 138 |
| 60Sn40Bi | 170 | 138 |
| 100Sn | 232 | 232 |
| 95Sn5Sb | 240 | 235 |
| 100Ga | 30 | 30 |
| 99In1Cu | 200 | — |
| 98In2Cu | 182 | — |
| 96In4Cu | 253 | — |
| 74In26Cd | 123 | 123 |
| 70In30Pb | 175 | 165 |
| 60In40Pb | 181 | 173 |
| 50In50Pb | 210 | 184 |
| 40In60Pb | 231 | 197 |
| 55.5Bi44.5Pb | 124 | 124 |
| 58Bi42Pb | 126 | 124 |
| 45.5Bi54.5Pb | 160 | 122 |
| 60Bi40Cd | 144 | 144 |
| 67.8Sn32.2Cd | 177 | 177 |
| 45Sn55Pb | 227 | 183 |
| 63Sn37Pb | 183 | 183 |
| 62Sn38Pb | 183 | 183 |
| 65Sn35Pb | 184 | 183 |
| 70Sn30Pb | 186 | 183 |
| 60Sn40Pb | 191 | 183 |
| 75Sn25Pb | 192 | 183 |
| 80Sn20Pb | 199 | 183 |
| 85Sn15Pb | 205 | 183 |
| 90Sn10Pb | 213 | 183 |
| 91Sn9Zn | 199 | 199 |
| 90Sn10Au | 217 | 217 |
| 99Sn1Cu | 227 | 227 |
| 99.3Sn0.7Cu | 227 | 227 |

An exemplary list thermoplastic polymers which may be utilized with embodiments of the invention are provided in Table 2.

TABLE 2

| Polymer | Melting Temperature (° C.) |
|---|---|
| Acrylic (PMMA) | 130-140 |
| Polyoxymethylene (POM or Acetal) | 166 |
| Polybutylene terephthalate (PBT) | 160 |
| Polycaprolactone (PCL) | 62 |
| Polyethylene terephthalate (PET) | 260 |
| Polycarbonate (PC) | 267 |
| Polyester | 260 |
| Polyethylene (PE) | 105-130 |
| Polyetheretherketone (PEEK) | 343 |
| Polylactic acid (PLA) | 50-80 |
| Polypropylene (PP) | 160 |
| Polystyrene (PS) | 240 |
| Polyvinylidene chloride (PVDC) | 185 |

In accordance with embodiments of the invention, bonding layers 128, 210 are formed with a uniform thickness and may be deposited by a variety of suitable methods depending upon the particular composition. For example, solder compositions may be sputtered, deposited by electron beam (E-beam) evaporation, or plated with a seed layer to obtain a uniform thickness.

Figure 3A:
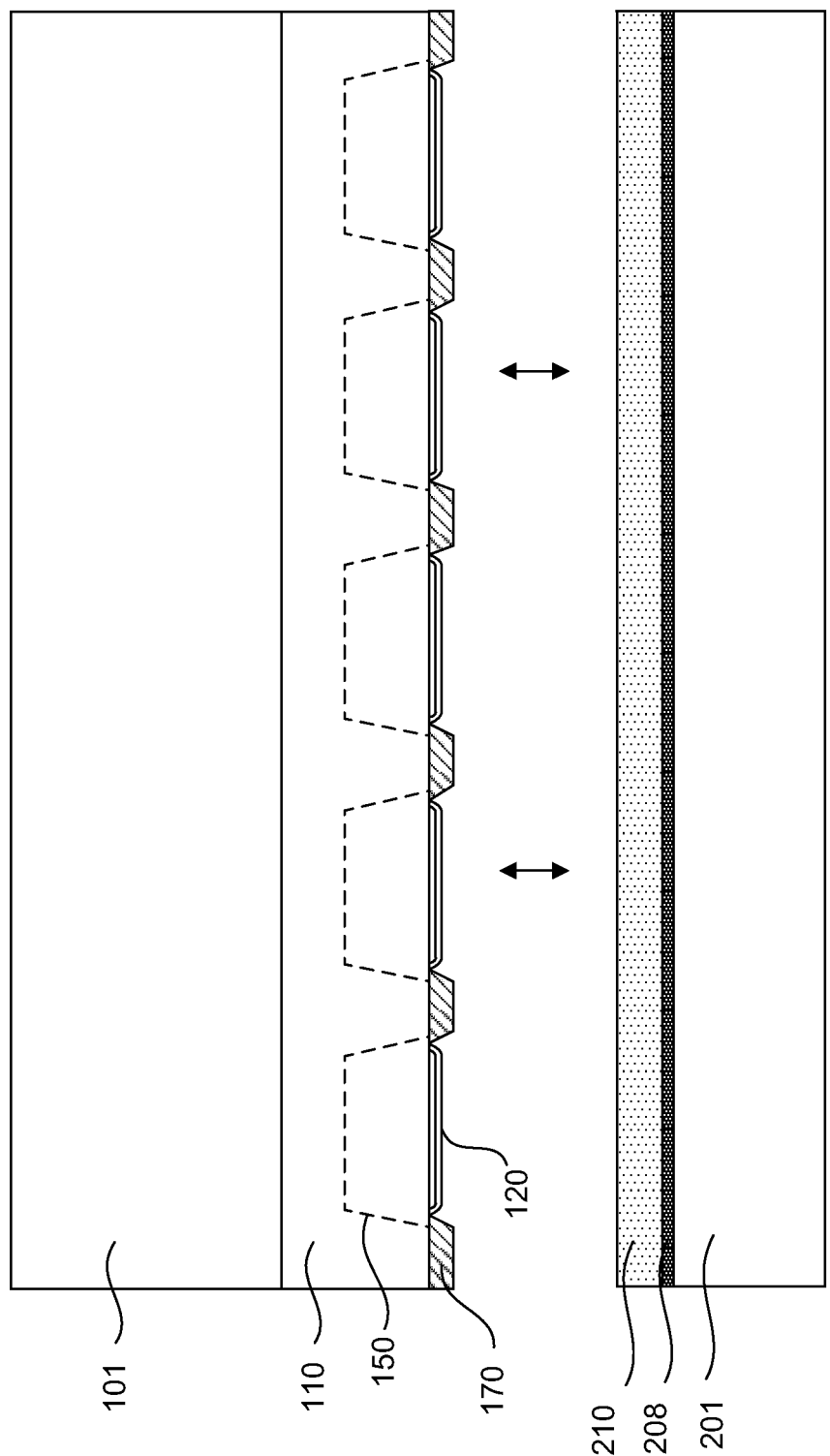
FIGS. 3A-3B are cross-sectional side view illustrations of bonding a growth substrate and carrier substrate together in accordance with an embodiment of the invention.
Figure 3B:
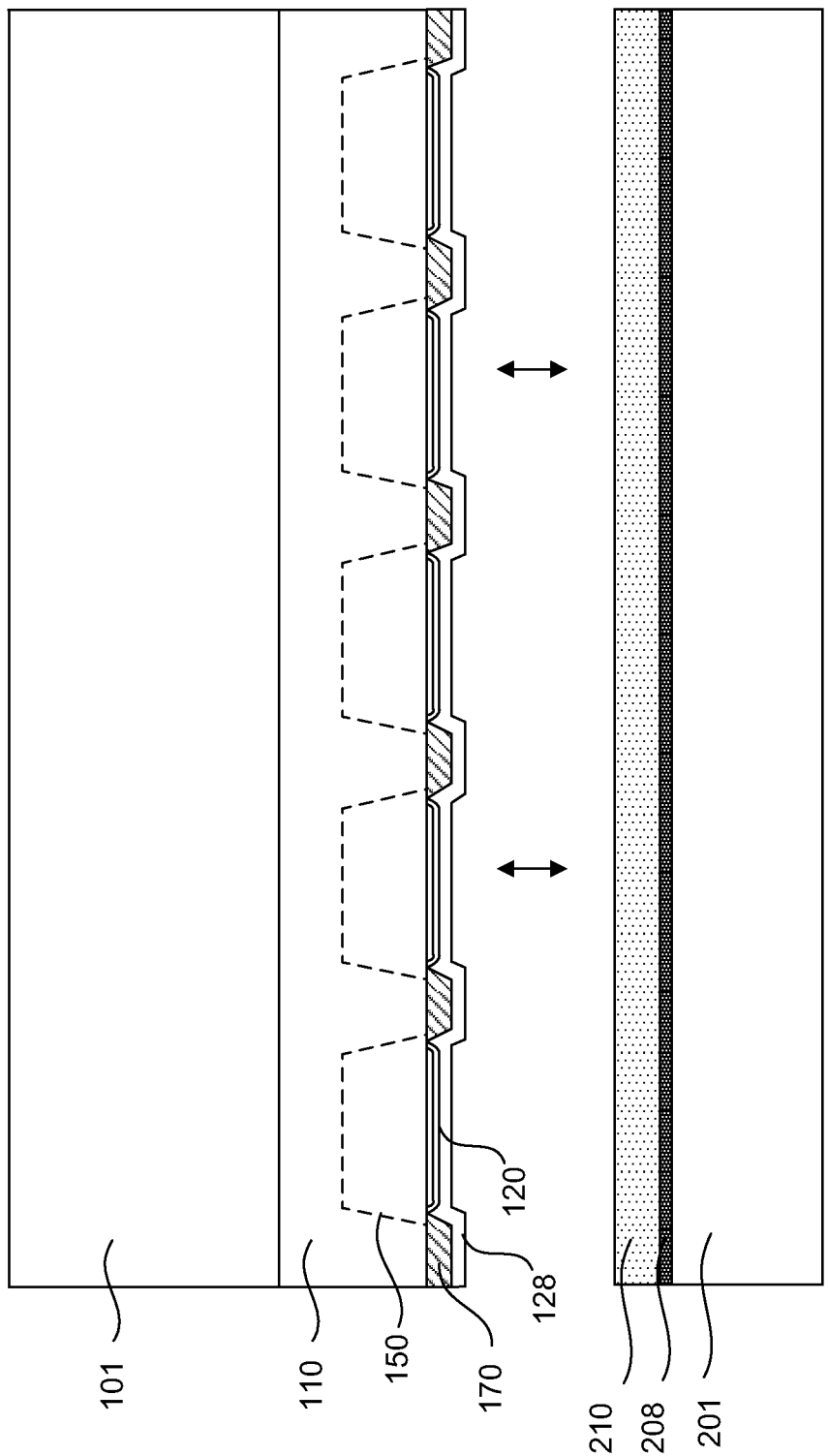

Referring now to FIGS. 3A-3B, the growth substrate 101 and carrier substrate 201 may be bonded together under heat and/or pressure. FIG. 3A is an illustration of an embodiment in which the structure of FIG. 1E is bonded to the unpatterned structure of FIG. 2A. FIG. 3B is an illustration of an embodiment in which the structure of FIG. 1F is bonded to the unpatterned structure of FIG. 2A. It is to be appreciated that these illustrations are exemplary and that other combinations with FIGS. 2A-2E or are contemplated in accordance with embodiments of the invention. In addition, growth substrate 101 and carrier substrate 201 may be bonded together utilizing only a single bonding layer 128 or 210.

In an embodiment, during bonding of the substrates illustrated in FIG. 3B, the electrically conductive bonding layer 128 may diffuse into the electrically conductive bonding layer 210, or vice versa, transforming layers 128, 210 into an alloy bonding layer. One function of the resultant bonding layer is to retain the micro LED device including the micro p-n diode in place on a carrier substrate, while also providing a medium from which the micro LED device is readily releasable. In some embodiments, one of the electrically conductive bonding layers 128, 210 is formed of a material with a melting or liquidus temperature greater than 350° C., or more particularly greater than 200° C., however the resultant alloy bonding layer is characterized by a melting or liquidus temperature of 350° C. or lower, or more particularly 200° C. or lower so as to provide a medium from which the micro LED can be picked up. Accordingly, the electrically conductive bonding layers 128, 210 are formed with specific compositions and thicknesses to achieve a desired alloy concentration upon interdiffusion of bonding layer 128 and bonding layer 210. In an embodiment, the compositions and thicknesses of the bonding layer 128 and bonding layer 210 are selected to achieve eutectic alloy bonding in which the eutectic alloy transforms directly from solid to liquid state at a specific composition and temperature without passing a two phase equilibrium of liquid and solid state.

In accordance with embodiments of the invention, the bonding interface produced with bonding layers 128, 210 may be stronger than the bonding interface using bonding layer 210 alone. The increased bonding interface strength can provide additional structural integrity for the system, for example during removal of the growth substrate 101 described in more detail below. For example, where a laser lift-off technique is used to remove the growth substrate the system is subjected to heat and mechanical shock waves which can potentially result in delamination of layers between the growth substrate 101 and carrier substrate 201 and cracking of the p-n diode layer 110. In accordance with embodiments of the invention, eutectic bonding of the bonding layers 128, 210 can create a strong bonding interface which protects against such delamination, thereby preserving the integrity of the p-n diode layer 110.

Figure 4:
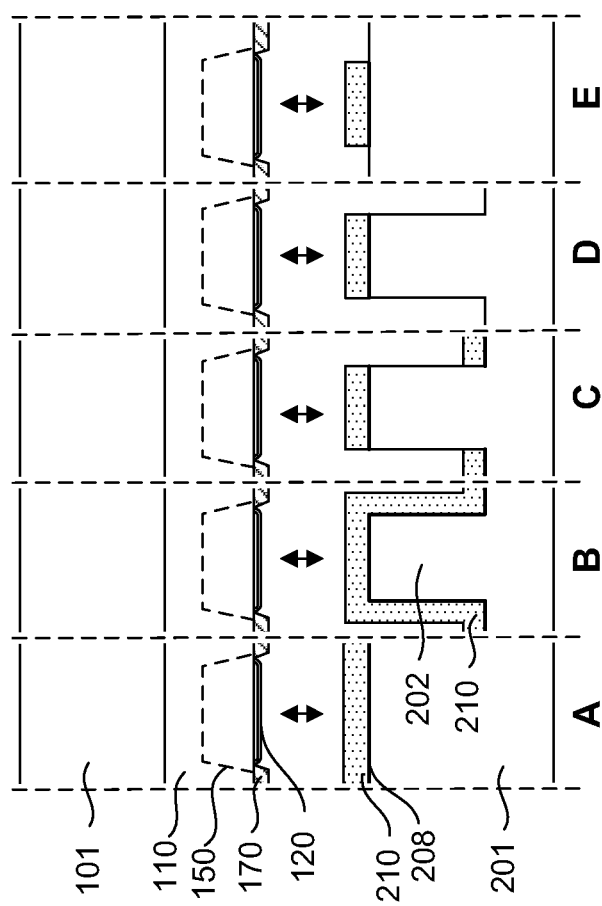
FIG. 4 is a cross-sectional side view illustration of various possible structures for the growth substrate and carrier substrate prior to bonding together in accordance with an embodiment of the invention
Figure 5:
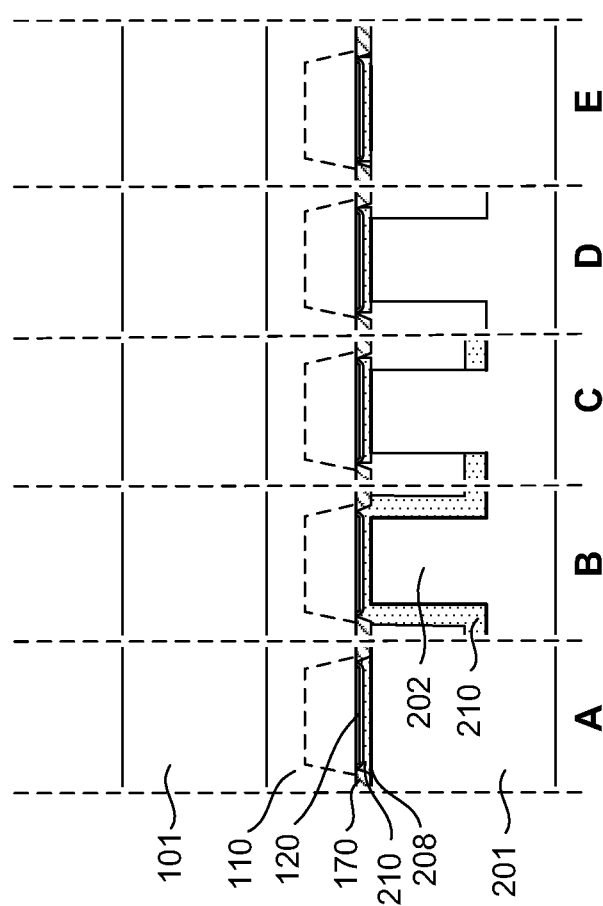
FIG. 5 is a cross-sectional side view illustration of various possible structures after bonding the growth substrate and carrier substrate together in accordance with an embodiment of the invention.

FIG. 4 is a cross-sectional side view illustration of various non-limiting possible structures of the growth substrate 101 and carrier substrate 201 presented side-by-side prior to bonding the growth substrate 101 and carrier substrate 201. FIG. 5 is a cross-sectional side view illustration of various non-limiting possible structures of the growth substrate 101 and carrier substrate 201 presented side-by-side after bonding the growth substrate 101 and carrier substrate 201. The particular combinations of substrates are described in Table 3. For example, the particular embodiment illustrated in FIG. 4, Example A, represents the bonding of the carrier substrate illustrated in FIG. 2A to the growth substrate illustrated in FIG. 1E. While not illustrated, as described above, in accordance with some embodiments a bonding layer 128 may optionally be included in addition to bonding layer 210 for alloy or fusion bonding, or in the alternative of bonding layer 210.

TABLE 3

|  | Ex. 4A | Ex. 4B | Ex. 4C | Ex. 4D | Ex. 4E |
|---|---|---|---|---|---|
| Carrier Substrate (2A-2D) | 2A | 2B | 2C | 2D | 2E |
| Growth Substrate (1E-1F) | 1E | 1E | 1E | 1E | 1E |

Still referring to FIG. 5, one feature of the illustrated embodiments is that the topography of the growth substrate 101 stack bonded to the carrier substrate 201 stack is embedded (or embossed) into the bonding layer 210 during the bonding operation. For example, the topography including the patterned sacrificial layer 170 and the reflective metallization stack 120 is embedded (or embossed) into the bonding layer 210. Referring to exemplary FIG. 5, Example A, in an embodiment when bonding under heat and pressure the patterned sacrificial layer 170 is embossed into the bonding layer 210 such that the bonding layer 210 flows into reservoirs created by the plurality of openings within the patterned sacrificial layer 170 including the plurality of metallization stacks 120. In an embodiment, the patterned sacrificial layer 170 is embossed completely through the bonding layer 210 to make contact with the underlying second substrate 201 (or adhesion layer 208 if present) thereby laterally separating the bonding layer 210 into a plurality of laterally separate locations. It is contemplated that laterally separating the bonding layer 210 into laterally separate locations corresponding to each individual micro LED device may assist in the pick up operation where the creation of phase change in one laterally separate location of bonding layer does not affect an adjacent laterally separate location of bonding layer. However, embodiments of the invention are not so limited and it is not required that the patterned sacrificial layer 170 is embedded (or embossed) completely through the bonding layer 210.

Another feature of the illustrated embodiments is that the patterned sacrificial layer 170 is a physical barrier between the p-n diode layer 110 and underlying metal layers (e.g. bonding layer 210, adhesion layer 208). Thus, patterned sacrificial layer 170 provides a barrier to metal contamination along the bottom surface of the micro p-n diodes 150 subsequently formed out of p-n diode layer 110.

Figure 6:
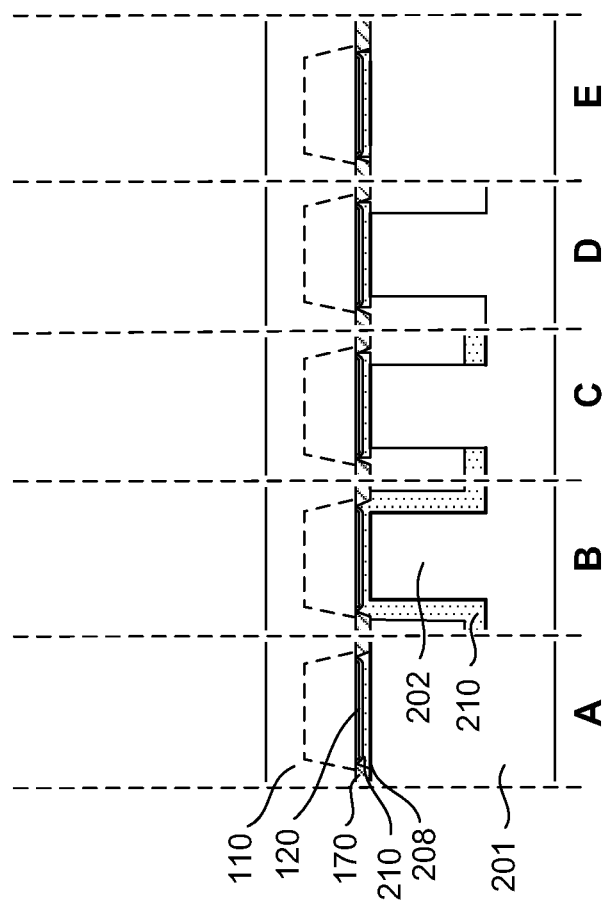
FIG. 6 is a cross-sectional side view illustration of the growth substrate removed from the bonded structure in accordance with an embodiment of the invention.

Referring now to FIG. 6, the growth substrate 101 has been removed from the bonded structure. Growth substrate 101 may be removed by a suitable method such as chemical etching or an excimer laser-based lift-off (LLO) if the growth substrate is transparent. In an embodiment, LLO of a GaN p-n diode layer 110 from a transparent sapphire growth substrate 101 is accomplished by irradiating the 101/110 layer interface through the transparent sapphire growth substrate 101 with a short pulse (e.g. tens of nanoseconds) from an ultraviolet laser such as a Nd-YAG laser or KrF excimer laser. Absorption in the GaN p-n diode layer 110 at the interface results in localized heating of the interface resulting in decomposition at the interfacial GaN to liquid Ga metal and nitrogen gas. Once the desired area has been irradiated, the transparent sapphire growth substrate 101 can be removed by remelting the Ga on a hotplate.

Figure 7:
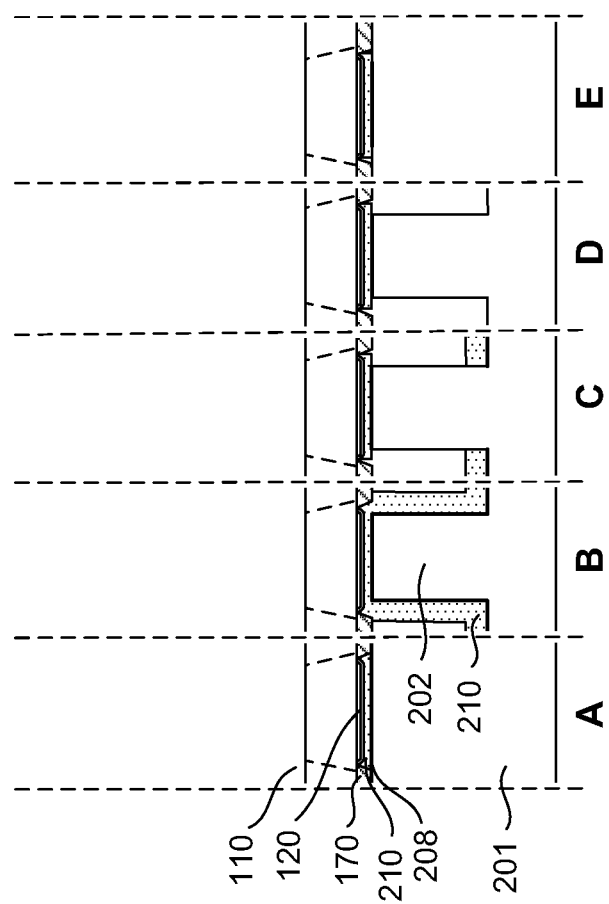
FIG. 7 is a cross-sectional side view illustration of a thinned-down p-n diode layer in accordance with an embodiment of the invention.

Referring now to FIG. 7, the p-n diode layer 110 is thinned down to a desirable thickness. Referring back to the enlarged p-n diode layer 110 in FIG. 1A, a predetermined amount of the bulk GaN layer 112 (which may be n-type) or a portion of the n-type GaN layer 114 are removed so that an operable p-n diode remains after thinning. Depending upon the underlying structure, the thinning process may be performed utilizing suitable techniques such as polishing, wet etching or dry etching. For example, a combination of polish and/or timed etch to a desired thickness may be performed. In circumstances where there are underlying patterned structures such as pillars, a timed etch to a desired thickness may be performed in order to avoid damaging the patterned structures.

Figure 8:
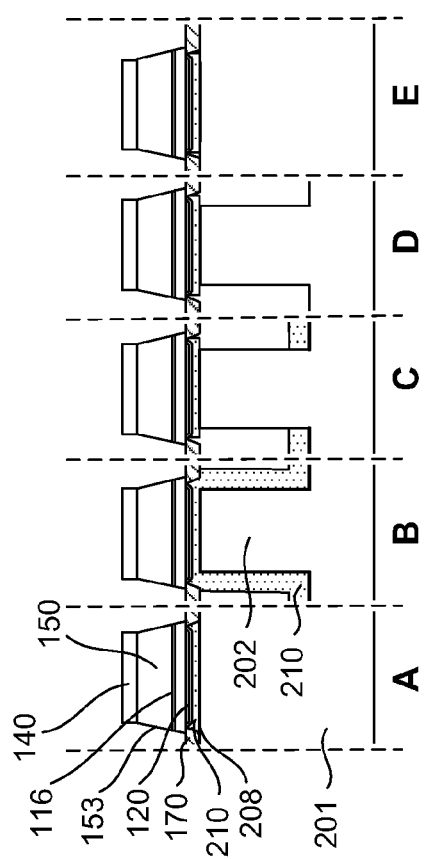
FIGS. 8-8' are cross-sectional side view illustrations of etching p-n diode layer to form micro p-n diodes in accordance with an embodiment of the invention.
Figure 8:
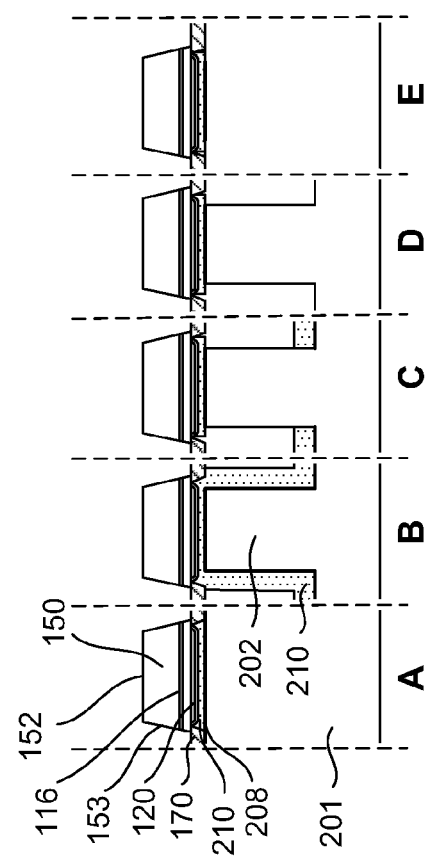

Referring now to FIG. 8, a patterned mask layer 140 may be formed over the thinned down p-n diode layer 110 for etching of p-n diode layer 110 to form a plurality of separate micro p-n diodes 150. Mask layer 140 may be formed from photoresist or a variety of materials such as metal (e.g. chromium, nickel) or dielectric (silicon nitride, silicon oxide) which are more resistant to the GaN etching conditions than is photoresist. Etching of the GaN p-n diode layer 110 can be performed utilizing dry plasma etching techniques such as reactive ion etching (RIE), electro-cyclotron resonance (ECR), inductively coupled plasma reactive ion etching (ICP-RIE), and chemically assisted ion-beam etching (CAME). The etch chemistries may be halogen-based, containing species such as $Cl_2$, $BCl_3$ or $SiCl_4$.

As illustrated, the patterned sacrificial layer 170 acts as an etch stop layer during etching of the GaN p-n diode layer 110. As a result, the patterned sacrificial layer 170 protects the sidewalls 153 of the micro p-n diodes 150, and the quantum well structure 116 located within from contamination by the underlying electrically conductive bonding layer 210, and adhesion layer 208 if present. For example, since the dry plasma etching chemistry sees a patterned sacrificial layer 170 (e.g $SiO_2$) instead of metal from the covered electrically conductive bonding layer 210 or adhesion layer 208, metal resputtering onto the p-n diode 150 sidewalls is eliminated.

In the particular embodiment illustrated in FIG. 8, micro p-n diodes 150 may have outwardly tapered sidewalls 153 (from top to bottom of the micro p-n diodes 150) up to 15 degrees. For example, RIE with a chlorine-based etch chemistry may be utilized. Alternatively, the sidewalls 153 may be vertical. For example, ICP-RIE which a chlorine-based etch chemistry may be utilized to obtain vertical sidewalls. As will become apparent in the description of FIG. 15, outwardly tapered sidewalls may be advantageous in some embodiments when forming a common contact over a series of micro LED devices which have been picked up and transferred to a receiving substrate. In certain embodiments, the pitch between the micro p-n diodes 150 may be 5 µm, 10 µm, or larger. For example, a micro p-n diode 150 array with a 5 µm pitch may be formed of 3 µm wide micro p-n diodes separated by a 2 µm spacing. A micro p-n diode 150 array with a 10 µm pitch may be formed of 8 µm wide micro p-n diodes separated by a 2 µm spacing. Upon completion of etching p-n diode layer 110 to form the plurality of separate micro p-n diodes 150, the patterned mask layer 140 may be removed exposing top surfaces 152 of the plurality of micro p-n diodes 150 as illustrated in FIG. 8'. Alternatively, the patterned mask layer 140 may be removed at a later time.

Referring now to FIG. 8", the patterned sacrificial layer 170 is selectively removed. In the particular embodiments illustrated, removal of the patterned sacrificial layer 170 exposes a portion of the bottom surface 151 of the micro p-n diodes 150. In addition, in the particular embodiments illustrated the patterned sacrificial layer 170 is completely removed. Removal may be performed with a liquid, vapor, or gas phase etchant. In an embodiment, where patterned sacrificial layer 170 is formed of $SiO_2$, the etchant can include liquid, vapor, or gas phase hydrofluoric acid (HF) or buffered hydrofluoric acid (BHF).

In an embodiment, if not already removed the patterned mask layer 140 can be removed in the same operation of removing the patterned sacrificial layer 170. Alternatively, where the etching solution has different selectivity to patterned sacrificial layer 170 and patterned mask layer 140, the patterned mask layer 140 can remain on the p-n diode 150 and be utilized to form a contact opening in a conformal dielectric barrier layer as described with regard to FIGS. 9-9'.

Still referring to FIG. 8" the micro LED array includes a carrier substrate 201, a plurality of locations of bonding layer 210 (that may or may not be an alloy bonding layer, and may or may not be laterally separate) on the carrier substrate, and a respective plurality of separate micro p-n diodes 150 over the plurality of locations of the bonding layer 210. A plurality of separate reflective metallization stacks 120 are formed between the respective plurality of separate micro p-n diodes 150 and the plurality of locations of the bonding layer 201. In some embodiments, the carrier substrate includes a respective plurality of pillars 202 on which the plurality of laterally separate locations of the bonding layer 210 are formed, as illustrated in Examples B-D.

In some embodiments, the micro p-n diodes 150 include a top surface 152 and a bottom surface 151, and the reflective metallization stack 120 includes a top surface and a bottom surface, and the bottom surface 151 of the micro p-n diode 150 is wider than the top surface of the reflective metallization stack 120. In some embodiments, the plurality of micro p-n diodes 150 each include a bottom surface 151 which has approximately the same width as a top surface of each of the respective plurality of pillars 202. In other embodiments, the plurality of micro p-n diodes 150 each include a bottom surface 151 which is wider than a top surface of each of the respective plurality of pillars 202. The relationship of the micro p-n diode 150 bottom width and underlying pillar 202 top surface may affect the pick up process. For example, if the bonding layer 210 exhibits a phase change from solid to liquid during the pick up process then the micro p-n diode 150 is essentially floating on a liquid layer. Surface tension forces in the liquid bonding layer 210 may retain the micro p-n diode 150 in place on top of the pillar 202. In particular, surface tension forces associated with the edges of the top surface of the pillar 202 may further assist in maintaining the micro p-n diode 150 in place where the pillar 202 top surface width is less than or approximately equal to the p-n diode 150 bottom width.

In accordance with some embodiments, the plurality of micro p-n diodes 150 are positioned over laterally separate locations of bonding layer 210. In an embodiment, as illustrated in Example A, laterally separate locations of bonding layer 210 can be created by embossing the patterned sacrificial layer through the bonding layer 210. In an embodiment, laterally separate locations of bonding layer 210 can be achieved by patterning the bonding layer 210 prior to bonding the growth substrate to the carrier substrate as illustrated in Example E, or by the formation of posts as illustrated in Examples B-D. In certain embodiments where trenches 206 are present between posts 202, the trenches may act as bonding layer reservoirs into which molten bonding layer may flow without interfering with an adjacent micro LED device. In an embodiment, the plurality of micro p-n diodes 150 each include a bottom surface 151 which has approximately the same or greater width than a corresponding top surface for a plurality of laterally separate locations of the alloy bonding layer 211.

Figure 9:
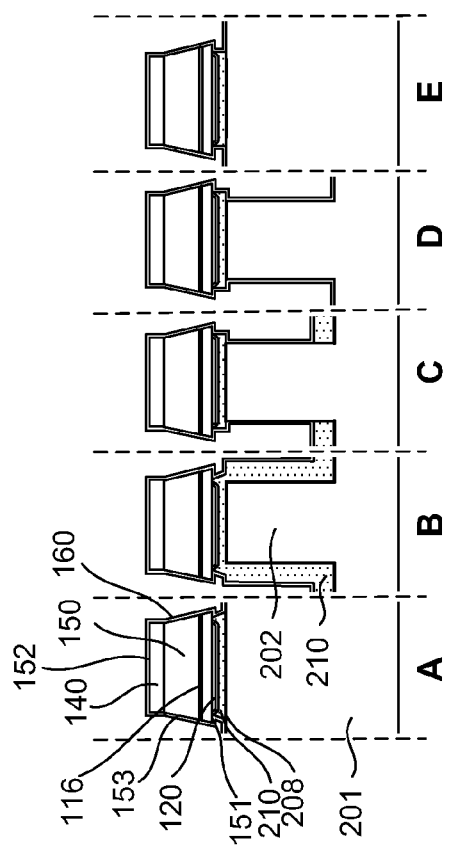
FIGS. 9-9' are cross-sectional side view illustrations of the formation of contact openings in a micro LED array in accordance with an embodiment of the invention.
Figure 9:
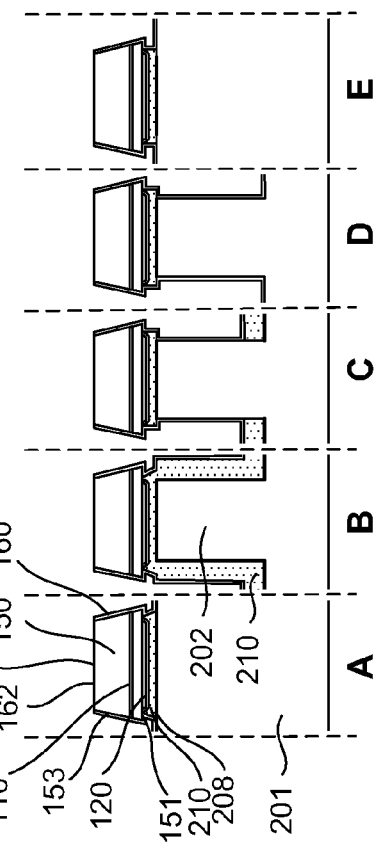

In some embodiments, the micro LED devices of FIG. 8″ are poised for pick up and transfer to a receiving substrate, for example with a transfer head. In other embodiments, a thin conformal dielectric barrier layer may be formed of an array of any of the micro p-n diodes 150 prior to pick up and transfer to a receiving substrate. Referring now to FIGS. 9-10″, a thin conformal dielectric barrier layer 160 may be formed over an array of any of the micro p-n diodes 150 of FIG. 8″. In one embodiment, the thin conformal dielectric barrier layer 160 may protect against charge arcing between adjacent micro p-n diodes 150 during the pick up process, and thereby protect against adjacent micro p-n diodes 150 from sticking together during the pick up process. The thin conformal dielectric barrier layer 160 may also protect the sidewalls 153, quantum well layer 116 and bottom surface 151, of the micro p-n diodes 150 from contamination which could affect the integrity of the micro p-n diodes 150. For example, the thin conformal dielectric barrier layer 160 can function as a physical barrier to wicking of the bonding layer material 210 (or alloy bonding layer) up the sidewalls and quantum layer 116 of the micro p-n diodes 150 during subsequent temperature cycles (particularly at temperatures above the liquidus or melting temperature of the bonding layer material 210) such as during picking up the micro device from the carrier substrate, and releasing the micro device onto the receiving substrate. The thin conformal dielectric barrier layer 160 may also insulate the micro p-n diodes 150 once placed on a receiving substrate. In an embodiment, the thin conformal dielectric barrier layer 160 is approximately 50-600 angstroms thick aluminum oxide ($Al_2O_3$). Conformal dielectric barrier layer 160 may be deposited by a variety of suitable techniques such as, but not limited to, atomic layer deposition (ALD).

Referring now to FIGS. 9-9', a thin conformal dielectric barrier layer 160 may be formed over an array of any of the micro p-n diodes 150 of FIG. 8″ in which the patterned mask layer 140 has not yet been removed. The thin conformal dielectric barrier layer 160 may be formed over an array of any of the micro p-n diodes 150 and is conformal to and spans across exposed surfaces of the mask layer 140, and sidewalls 153 and a portion of the bottom surface 151 of the p-n diode 150. The conformal dielectric barrier layer 160 may also span across exposed surfaces of bonding layer 210. The mask layer 140 is then removed with a lift off technique, lifting off the portion of the thin conformal dielectric barrier layer 160 formed thereon resulting in the structure illustrated in FIG. 9' including contact openings 162. In the particular embodiment illustrated in FIG. 9', the conformal dielectric barrier layer 160 is not formed on the top surface 152 of the micro p-n diodes 150.

Referring to FIGS. 10-10″ the thin conformal dielectric layer can also be formed over the array of micro p-n diodes 150 of FIG. 8″ followed by patterning to create contact openings 162. As illustrated in FIG. 10, the thin conformal dielectric barrier layer 160 may be formed over an array of any of the micro p-n diodes 150 and is conformal to and spans across the exposed top surface 152 and sidewalls 153 of the p-n diodes 150. The dielectric barrier layer 160 may also span across the exposed bottom surface 151 of the p-n diodes 150 and bonding layer 210. A blanket photoresist layer may then be formed over the p-n diode array and carrier substrate 201, and then patterned to form openings over each micro p-n diode 150. The thin conformal dielectric barrier layer 160 may then be etched to form contact openings 162 on the top surface 152 of each micro p-n diode 150. Contact openings 162 are illustrated in FIGS. 10'-10″ after removal of the patterned photoresist. As illustrated in FIG. 10', contact openings 162 may have a slightly larger width than the top surface 152 of the micro p-n diodes 150. In the embodiment illustrated in FIG. 10' the contact openings 162 expose the top surfaces of the micro p-n diodes 150 and an upper portion of the sidewalls of the micro p-n diodes 150, while the dielectric barrier layer 160 covers and insulates the quantum well layers 116. As illustrated in FIG. 10″, contact openings 162 may have a slightly smaller width than the top surface 152 of the micro p-n diodes 150. The difference in width may be a result of adjusting for an alignment tolerance in patterning the photoresist. As a result, the conformal dielectric barrier layer 160 may form a lip around the top surface and sidewalls of the micro p-n diodes 150.

Figure 11A:
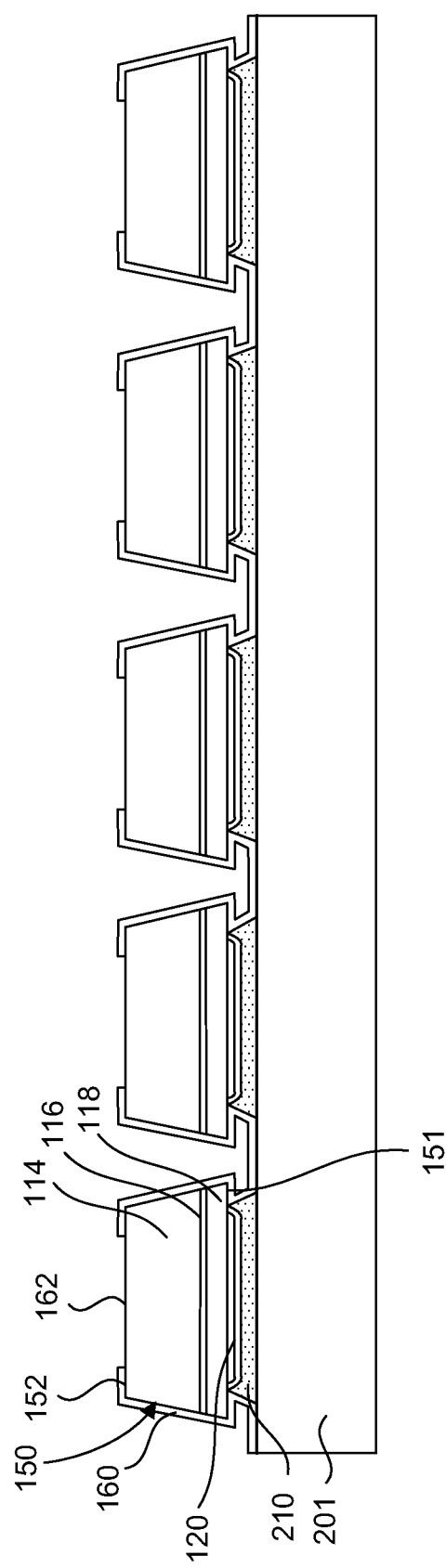
FIGS. 11A-11B are cross-sectional side view illustrations of an array of micro LED devices on a carrier substrate in accordance with an embodiment of the invention.
Figure 11B:
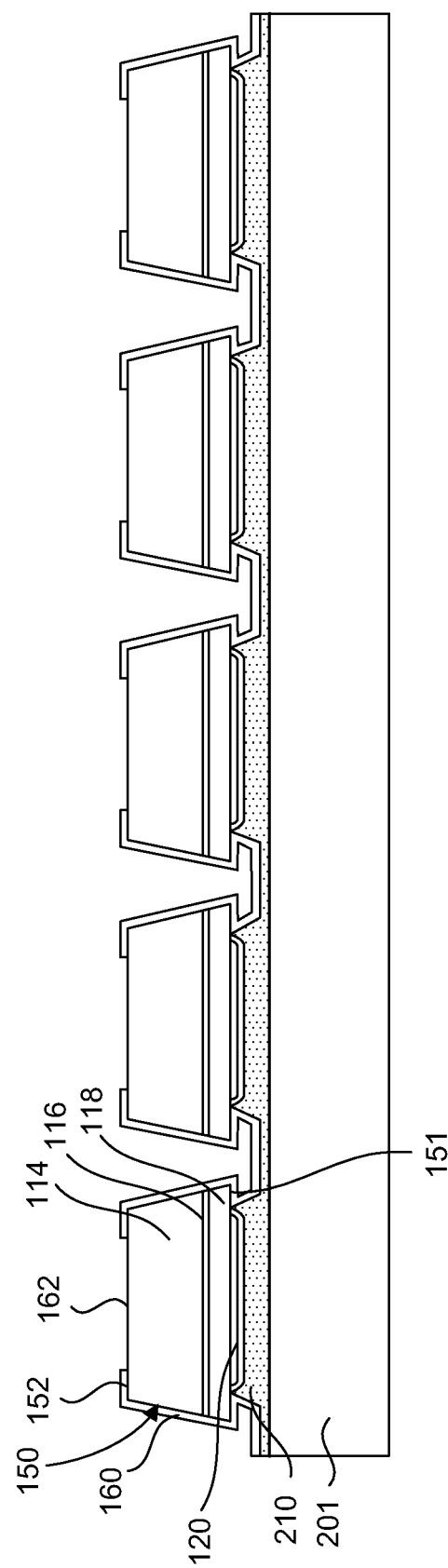

An exemplary array of micro LED devices from FIG. 10″ Example A are illustrated in FIG. 11A. In the particular embodiment illustrated in FIG. 11A, the patterned sacrificial layer was embossed completely through the bonding layer 210 to create a plurality of laterally separate locations of bonding layer 210. Referring now to FIG. 11B, in the particular embodiment illustrated the patterned sacrificial layer was not embossed completely through the bonding layer 210, and the separate locations of bonding layer 210 are not laterally separate.

Figure 12B:
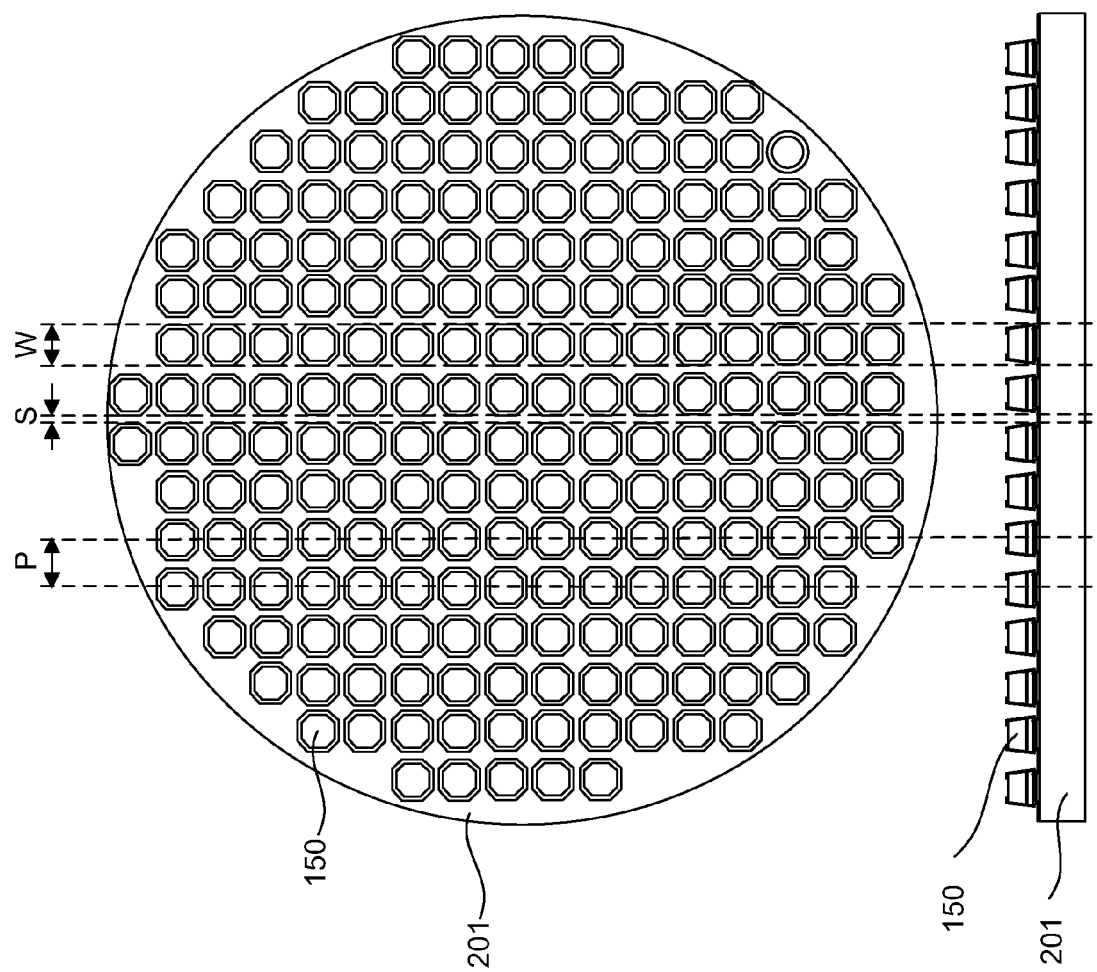

FIGS. 12A-12B include top and cross-sectional side view illustrations of a carrier substrate 201 and array of micro LED devices in accordance with an embodiment of the invention. In the particular embodiments illustrated, the arrays are produced from micro LED devices in FIG. 11A. However, it is to be appreciated that FIGS. 12A-12B are meant to be exemplary, and that the array of micro LED devices can be formed from any of the micro LED devices previously described. In the embodiment illustrated in FIG. 12A, each individual micro p-n diode 150 is illustrated as a pair of concentric circles having different diameters or widths corresponding the different widths of the top and bottom surfaces of the micro p-n diode 150, and the corresponding tapered sidewalls spanning between the top and bottom surfaces. In the embodiment illustrated in FIG. 12B, each individual micro p-n diode 150 is illustrated as a pair of concentric squares with tapered or rounded corners, with each square having a different width corresponding to the different widths of the top and bottom surfaces of the micro p-n diode 150, and the corresponding tapered sidewalls spanning from the top and bottom surfaces. However, embodiments of the invention do not require tapered sidewalls, and the top and bottom surfaces of the micro p-n diode 150 may have the same diameter, or width, and vertical sidewalls. As illustrated in FIGS. 12A-12B the array of micro LED devices is described as having a pitch (P), spacing (S) between each micro LED device and maximum width (W) of each micro LED device. In order for clarity and conciseness, only x-dimensions are illustrated by the dotted lines in the top view illustration, though it is understood that similar y-dimensions may exist, and may have the same or different dimensional values. In the particular embodiments illustrated in FIGS. 12A-12B, the x- and y-dimensional values are identical in the top view illustration. In one embodiment, the array of micro LED devices may have a pitch (P) of 10 μm, with each micro LED device having a spacing (S) of 2 μm and maximum width (W) of 8 μm. In another embodiment, the array of micro LED devices may have a pitch (P) of 5 μm, with each micro LED device having a spacing (S) of 2 μm and maximum width (W) of 3

μm. However, embodiments of the invention are not limited to these specific dimensions, and any suitable dimension may be utilized.

Figure 13:
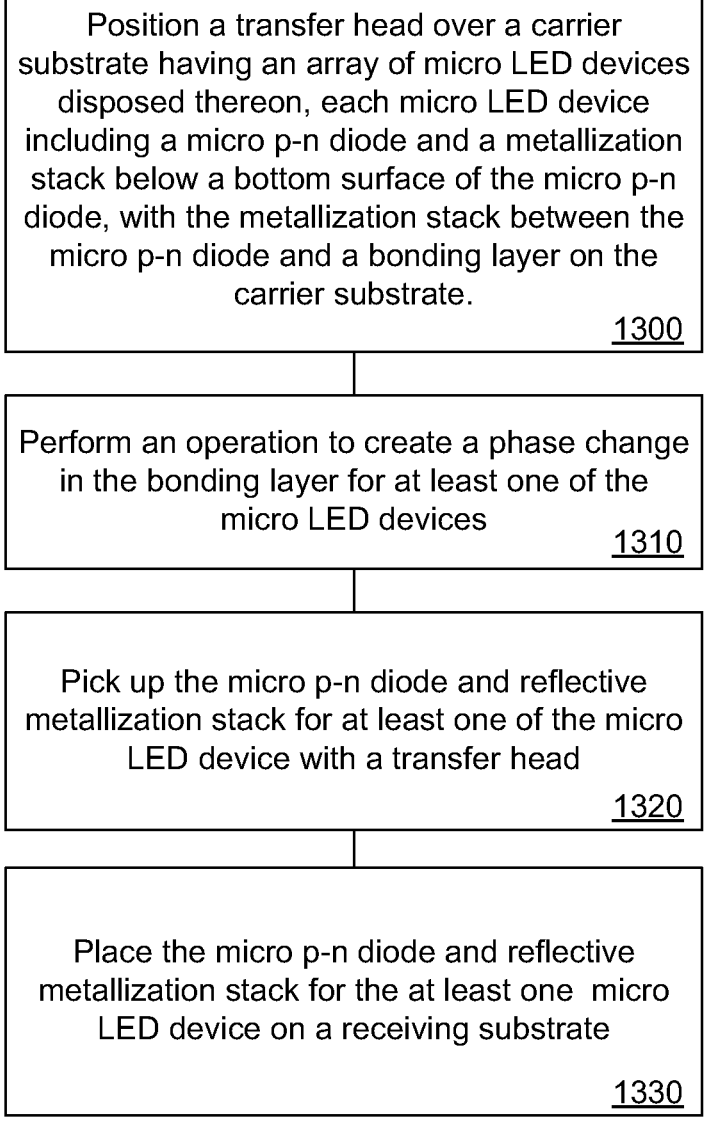
FIG. 13 is a flow chart illustrating a method of picking up and transferring a micro LED device from a carrier substrate to a receiving substrate in accordance with an embodiment of the invention.

An embodiment of a method of transferring a micro LED device to a receiving substrate is described in FIG. 13. In such an embodiment a carrier substrate is provided having an array of micro LED devices disposed thereon. As described above, each micro LED device may include a micro p-n diode and a reflective metallization stack below a bottom surface of the micro p-n diode, with the metallization stack being between the micro p-n diode and a bonding layer on the carrier substrate. A conformal dielectric barrier layer may optionally span sidewalls of the micro p-n diode. The conformal dielectric barrier layer may additionally span a portion of the bottom surface of the micro p-n diode. At operation 1310 a phase change is created in the bonding layer for at least one of the micro LED devices. For example, the phase change may be associated with heating the bonding layer above a melting temperature or liquidus temperature of a material forming the bonding layer. Heat may be applied to the bonding layer to create the phase change from a variety of sources, including local heat transfer, heat transfer through the carrier substrate, heat transfer through the transfer head, and combinations thereof. The micro p-n diode, metallization stack, and optionally a portion of the conformal dielectric barrier layer for at least one of the micro LED devices, and optionally a portion of bonding layer may then be picked up with a transfer head at operation 1320 and then placed on a receiving substrate at operation 1330. Heat may be applied to the bonding layer during the placement operation, and may be provided from a variety of sources, including local heat transfer, heat transfer through the receiving substrate, heat transfer through the transfer head, and combinations thereof.

Figure 14:
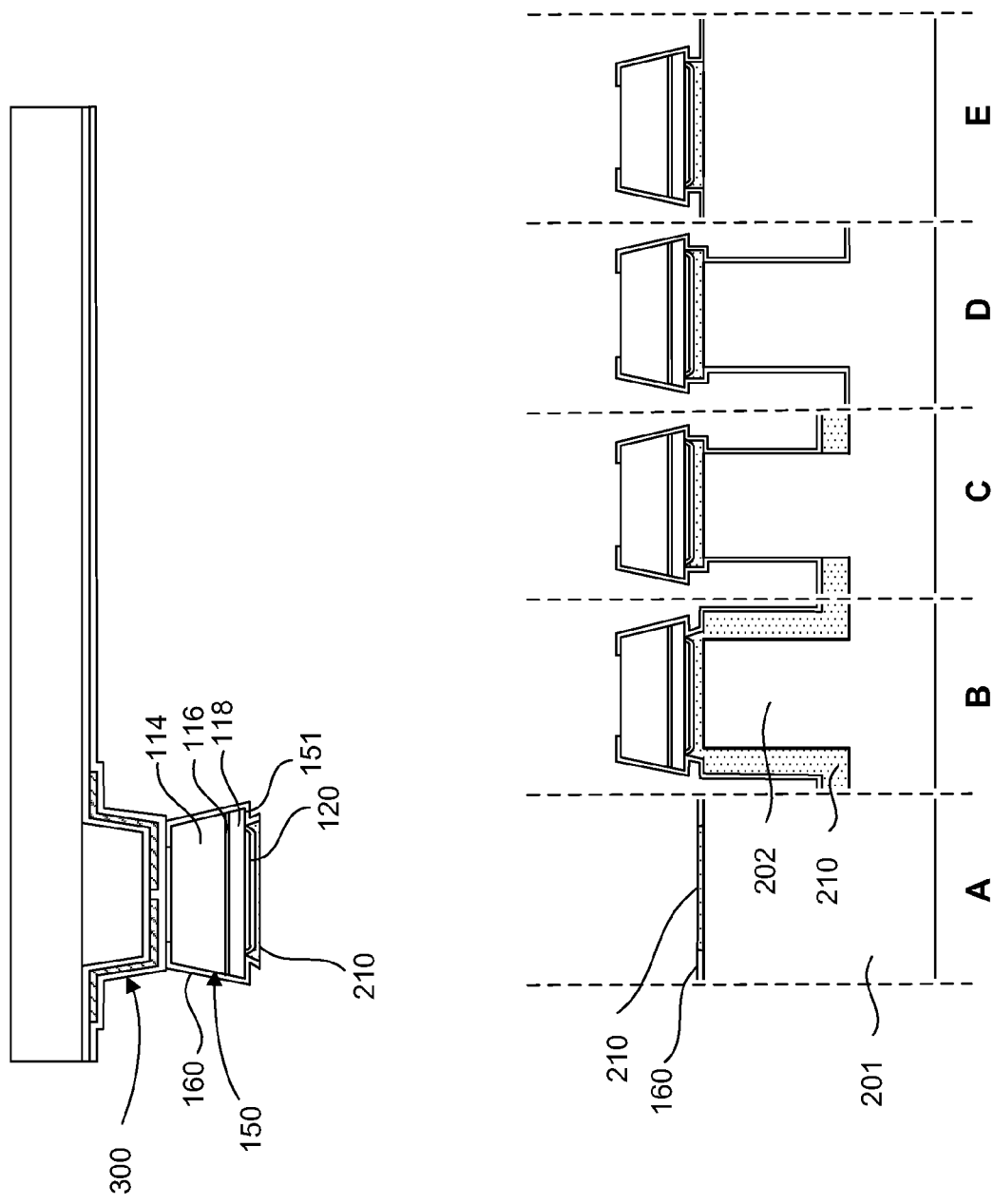
FIG. 14 is a cross-sectional side view illustration of a transfer head picking up a micro LED device from a carrier substrate in accordance with an embodiment of the invention.

A general illustration of operation 1320 in accordance with an embodiment is provided in FIG. 14 in which a transfer head 300 picks up a micro p-n diode 150, metallization stack 120, a portion of the conformal dielectric barrier layer 160 for at least one of the micro LED devices, and a portion of bonding layer 210. In the particular embodiment illustrated a conformal dielectric barrier layer 160 has been formed, however, in other embodiments a conformal dielectric barrier layer may not be present. In some embodiments a portion of bonding layer 210, such as approximately half, may be lifted off with the micro LED device. While a specific micro LED device including micro p-n diode 150 of Example A is illustrated, it is understood than any of the micro LED devices including any of the micro p-n diodes 150 described herein may be picked up. In addition, while the embodiment illustrated in FIG. 14 shows a transfer head 300 picking up a single micro LED device, transfer head 300 or a plurality of transfer heads 300 may pick up a group of micro LED devices in other embodiments.

Still referring to FIG. 14, in the particular embodiment illustrated the bottom surface 151 of the micro p-n diode 150 is wider than the top surface of the reflective metallization stack 120 which is in contact with the bottom surface 151, and the conformal dielectric barrier layer 160 spans the sidewalls of the micro p-n diode 150, a portion of the bottom surface 151 of the micro p-n diode 150. In one aspect, the portion of the conformal dielectric barrier layer 160 wrapping underneath the micro p-n diode 150 protects the conformal dielectric barrier layer 160 on the sidewalls of the micro p-n diode 150 from chipping or breaking during the pick up operation with the transfer head 300. Stress points may be created in the conformal dielectric barrier layer 160 bonding layer 210, particularly at corners and locations with sharp angles. Upon contacting the micro LED device with the transfer head 300 and/or creating the phase change in the bonding layer, these stress points become natural break points in the conformal dielectric barrier layer 160 at which the conformal dielectric layer can be cleaved. In an embodiment, the conformal dielectric barrier layer 160 is cleaved at the natural break points after contacting the micro LED device with the transfer head and/or creating the phase change in the alloy bonding layer, which may be prior to or during picking up the micro p-n diode and the reflective metallization stack. In the liquid state the bonding layer may smooth out over the underlying structure in response to compressive forces associated with contacting the micro LED device with the transfer head. In an embodiment, after contacting the micro LED device with the transfer head, the transfer head is rubbed across a top surface of the micro LED device prior to creating the phase change in the alloy bonding layer. Rubbing may dislodge any particles which may be present on the contacting surface of either of the transfer head or micro LED device. Rubbing may also transfer pressure to the conformal dielectric barrier layer. Thus, both transferring a pressure from the transfer head 300 to the conformal dielectric barrier layer 160 and heating the alloy bonding layer above a liquidus temperature of the alloy bonding layer can contribute to cleaving the conformal dielectric barrier layer 160 at a location underneath the micro p-n diode 150 and may preserve the integrity of the micro LED device and quantum well layer 116.

In an embodiment, the bottom surface of the micro p-n diode 150 is wider than the top surface of the metallization stack 120, and the conformal dielectric barrier layer 160 is formed on a portion of the bottom surface of the micro p-n diode 150. In an embodiment, a 0.25 μm to 1 μm distance along the bottom surface micro p-n diode 150 on each side of the metallization stack 120 accommodates a 50 angstrom to 600 angstrom thick conformal dielectric barrier layer 160.

A variety of suitable transfer heads can be utilized to aid in the pick up and placement operations 1320, 1330 in accordance with embodiments of the invention. For example, the transfer head 300 may exert a pick up pressure on the micro LED device in accordance with vacuum, magnetic, adhesive, or electrostatic principles in order to pick up the micro LED device. In a particular embodiment, transfer head operates in accordance with electrostatic principles. Transfer head 300 may also be configured to transfer heat to the micro LED device to control the phase of a bonding layer during pick up and placement operations associated with a transfer process.

Figure 15:
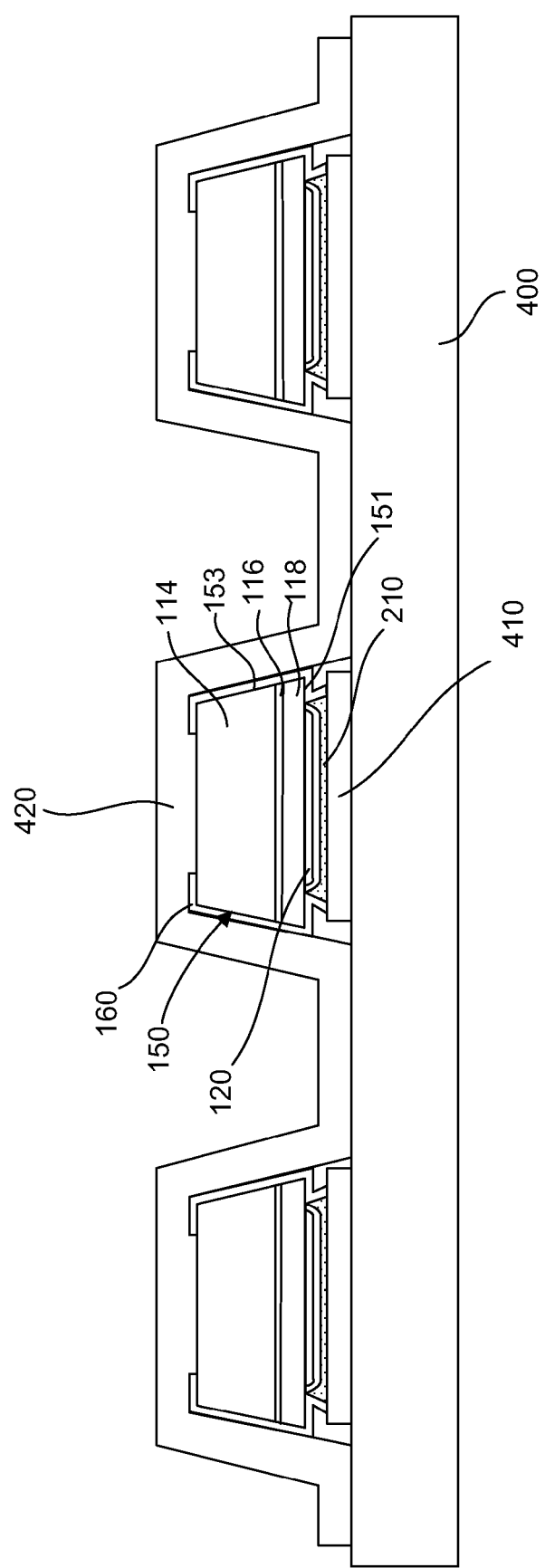
FIG. 15 is a cross-sectional side view illustration of a receiving substrate with a micro LED device in accordance with an embodiment of the invention.

FIG. 15 is an illustration of a receiving substrate 400 onto which a plurality of micro LED devices have been placed in accordance with an embodiment of the invention. For example, the receiving substrate may be, but is not limited to, a display substrate, a lighting substrate, a substrate with functional devices such as transistors, or a substrate with metal redistribution lines. In the particular embodiment illustrated, each micro LED device may be placed over a driver contact 410. A common contact line 420 may then be formed over the series of micro p-n diodes 150. As illustrated, the tapered sidewalls of the micro p-n diodes 150 may provide a topography which facilitates the formation of a continuous contact line. In an embodiment, the common contact line 420 can be formed over a series of red-emitting, green-emitting or blue-emitting micro LEDs. In certain embodiments, the common contact line 420 will be formed from a transparent contact material such as indium tin oxide (ITO). In one embodiment, the plurality of micro LEDs may be arranged into pixel groups of three including a red-emitting micro LED, green-emitting micro LED, and a blue-emitting micro LED.

In one embodiment, the p-n diode 150 may include a top n-doped layer 114 with a thickness of approximately 0.1 μm-3 μm, quantum well layer 116 (which may be SQW or MQW) with a thickness less than approximately 0.3 μm, and lower p-doped layer 118 with thickness of approximately 0.1 μm-1 μm. In an embodiment, top n-doped layer 114 may be 0.1 μm-6 μm thick (which may include or replace bulk layer 112 previously described). In a specific embodiment, p-n diodes 150 may be less than 3 μm thick, and less than 10 μm wide.

In another aspect, embodiments of the invention describe a manner for mass transfer of an array of pre-fabricated micro devices with an array of transfer heads. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each transfer head in the array of transfer heads may also be independently controllable, which enables selective pick up and release of the micro devices.

Without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip force on a micro device and pick up the micro device. Grip force is proportional to charged plate area so is calculated as a pressure.

In another aspect, embodiments of the invention describe a bonding layer which can maintain a micro device on a carrier substrate during certain processing and handling operations, and upon undergoing a phase change provides a medium on which the micro device can be retained yet is also readily releasable from during a pick up operation. For example, the bonding layer may be remeltable or reflowable such that the bonding layer undergoes a phase change from solid to liquid state prior to or during the pick up operation. In the liquid state the bonding layer may retain the micro device in place on a carrier substrate while also providing a medium from which the micro device is readily releasable. Without being limited to a particular theory, in determining the grip pressure which is necessary to pick up the micro device from the carrier substrate the grip pressure should exceed the forces holding the micro device to the carrier substrate, which may include but are not limited to, surface tension forces, capillary forces, viscous effects, elastic restoration forces, van-der-Waals forces, stiction and gravity.

In accordance with embodiments of the invention, when the dimensions of a micro device are reduced below a certain range, the surface tension forces of the liquid bonding layer holding the micro device to the carrier substrate may become dominant over other forces holding the micro device. For example, an exemplary 10 μm by 10 μm wide micro device is retained on a carrier substrate with a surface tension pressure of approximately 2.2 atmospheres (atm) with an indium bonding layer having a liquid surface tension of 560 mN/m at its melting temperature of 156.7° C. This is significantly larger than the pressure due to gravity, which is approximately $1.8 \times 10^{-6}$ atm for an exemplary 10 μm×10 μm wide×3 μm tall piece of gallium nitride (GaN).

Figure 16:
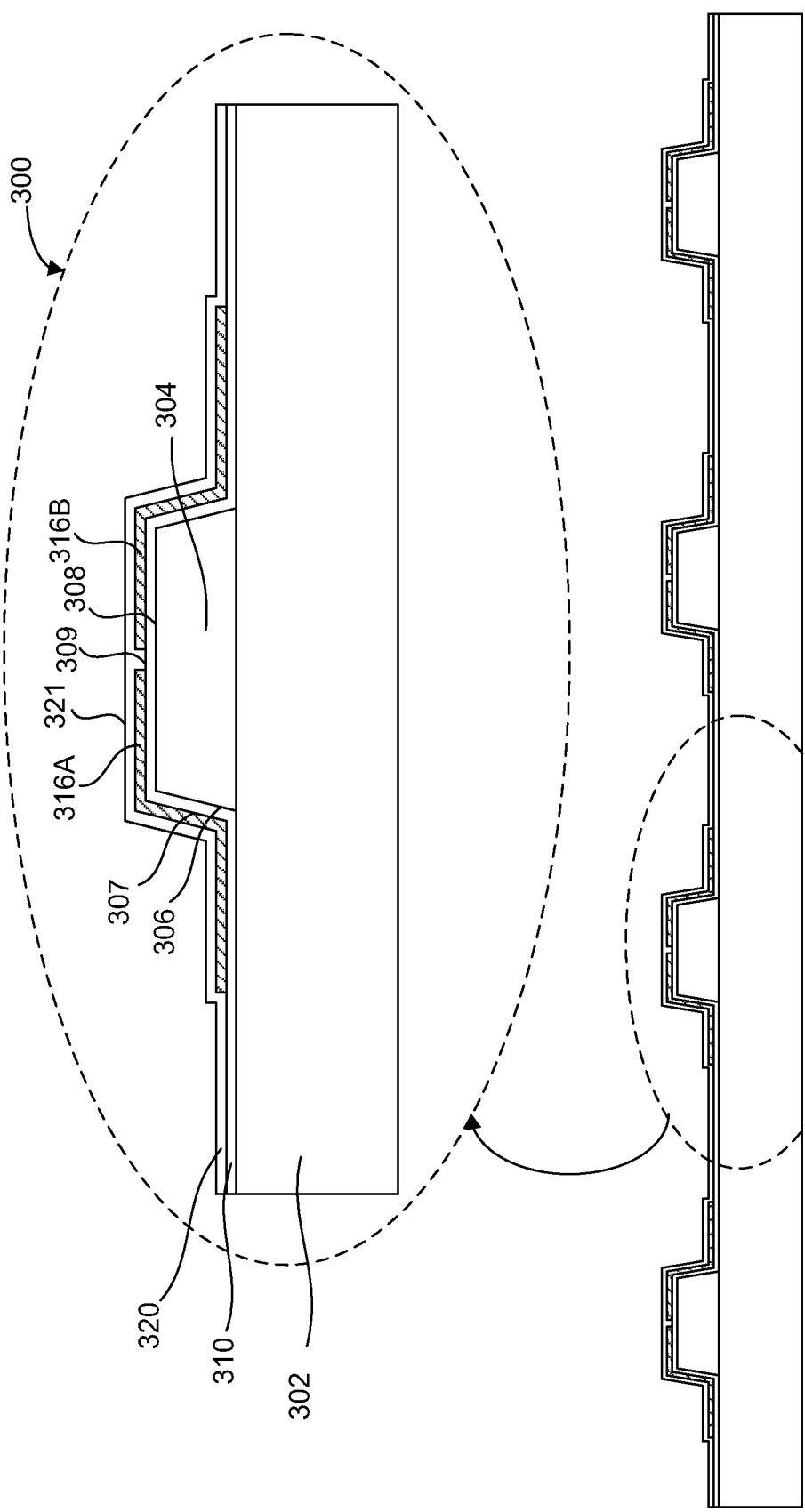
FIG. 16 is a cross-sectional side view illustration of a bipolar micro device transfer head in accordance with an embodiment of the invention.

FIG. 16 is a cross-sectional side view illustration of a bipolar micro device transfer head and head array which operates according to electrostatic principles in order to pick up the micro LED device in accordance with an embodiment of the invention. As illustrated, the micro device transfer head 300 may include a base substrate 302, a mesa structure 304 including a top surface 308 and sidewalls 306, an optional passivation layer 310 formed over the mesa structure 304 and including a top surface 309 and sidewalls 307, a pair of electrodes 316A, 316B formed over the mesa structure 304 (and optional passivation layer 310) and a dielectric layer 320 with a top surface 321 covering the electrodes 316A, 316B. Base substrate 302 may be formed from a variety of materials such as silicon, ceramics and polymers which are capable of providing structural support. In an embodiment, base substrate has a conductivity between $10^3$ and $10^{18}$ ohm-cm. Base substrate 302 may additionally include wiring (not shown) to connect the micro device transfer heads 300 to the working electronics of an electrostatic gripper assembly.

The mesa structures 304 generate a profile which protrudes away from the base substrate so as to provide a localized contact point to pick up a specific micro device during a pick up operation. In an embodiment, mesa structures 304 have a height of approximately 1 μm to 5 μm, or more specifically approximately 2 μm. Specific dimensions of the mesa structures 304 may depend upon the specific dimensions of the micro devices to be picked up, as well as the thickness of any layers formed over the mesa structures. In an embodiment, the height, width, and planarity of the array of mesa structures 304 on the base substrate 302 are uniform across the base substrate so that each micro device transfer head 300 is capable of making contact with each corresponding micro device during the pick up operation. In an embodiment, the width across the top surface 321 of each micro device transfer head is slightly larger, approximately the same, or less than the width of the top surface of the each micro device in the corresponding micro device array so that a transfer head does not inadvertently make contact with a micro device adjacent to the intended corresponding micro device during the pick up operation.

Mesa structure 304 has a top surface 308, which may be planar, and sidewalls 306. In an embodiment, sidewalls 306 may be tapered up to 10 degrees, for example. Tapering the sidewalls 306 may be beneficial in forming the electrodes 316 and electrode leads 314. Passivation layer 310 can be deposited by a variety of suitable techniques such as chemical vapor deposition (CVD), sputtering, or atomic layer deposition (ALD). In an embodiment, passivation layer 310 may be 0.5 μm-2.0 μm thick oxide such as, but not limited to, silicon oxide ($SiO_2$), aluminum oxide ($Al_2O_3$) or tantalum oxide ($Ta_2O_5$). Electrodes 316A, 316B may be a single layer or multiple layers. A variety of electrically conductive materials including metals, metal alloys, refractory metals, and refractory metal alloys may be employed to form electrodes 316A, 316B. In an embodiment, the electrodes 316A, 316B have a thickness up to 5,000 angstroms (0.5 μm). In an embodiment, the electrodes 316A, 316B include a high melting temperature metal such as platinum or a refractory metal or refractory metal alloy. For example, electrodes 316A, 316B may include platinum, titanium, vanadium, chromium, zirconium, niobium, molybdenum, ruthenium, rhodium, hafnium, tantalum, tungsten, rhenium, osmium, iridium and alloys thereof. Refractory metals and refractory metal alloys generally exhibit higher resistance to heat and wear than other metals. In an embodiment, electrodes 316A, 316B are approximately 500 angstrom (0.05 μm) thick titanium tungsten (TiW) refractory metal alloy.

Dielectric layer 320 has a suitable thickness and dielectric constant for achieving the required grip pressure of the micro device transfer head 300, and sufficient dielectric strength to not break down at the operating voltage. The dielectric layer may be a single layer or multiple layers. In an embodiment, the dielectric layer is 0.5 μm-2.0 μm thick, though thickness may be more or less depending upon the specific topography of the transfer head 300 and underlying mesa structure 304. Suitable dielectric materials may include, but are not limited to, aluminum oxide ($Al_2O_3$) and tantalum oxide ($Ta_2O_5$). In accordance with embodiments of the invention, the dielectric layer 320 possesses a dielectric strength greater than the applied electric field so as to avoid shorting of the transfer head during operation. Dielectric layer 320 can be deposited by a variety of suitable techniques such as chemical vapor deposition (CVD), atomic layer deposition (ALD) and physical vapor deposition (PVD) such as sputtering. Dielectric layer 320 may additionally be annealed following deposition. In one embodiment, the dielectric layer 320 possesses a dielectric strength of at least 400 V/μm. Techniques such as ALD can be utilized to deposit uniform, conformal, dense, and/or pin-hole free dielectric layers with good dielectric strength. Multiple layers can also be utilized to achieve such a pin-hole free dielectric layer 320. Multiple layers of different dielectric materials may also be utilized to form dielectric layer 320. In an embodiment, the underlying electrodes 316A, 316B include platinum or a refractory metal or refractory metal alloy possessing a melting temperature above the deposition temperature of the dielectric layer material(s) so as to not be a limiting factor in selecting the deposition temperature of the dielectric layer.

The following description corresponding to FIGS. 17-23B describes various manners for picking up a micro LED device and array of micro LED devices. It is be appreciated that while certain micro LED devices are described and illustrated in FIGS. 17-23B, that the micro LED devices can be any of the micro LED device structures previously illustrated and described above with regard to FIGS. 1-15.

Figure 17:
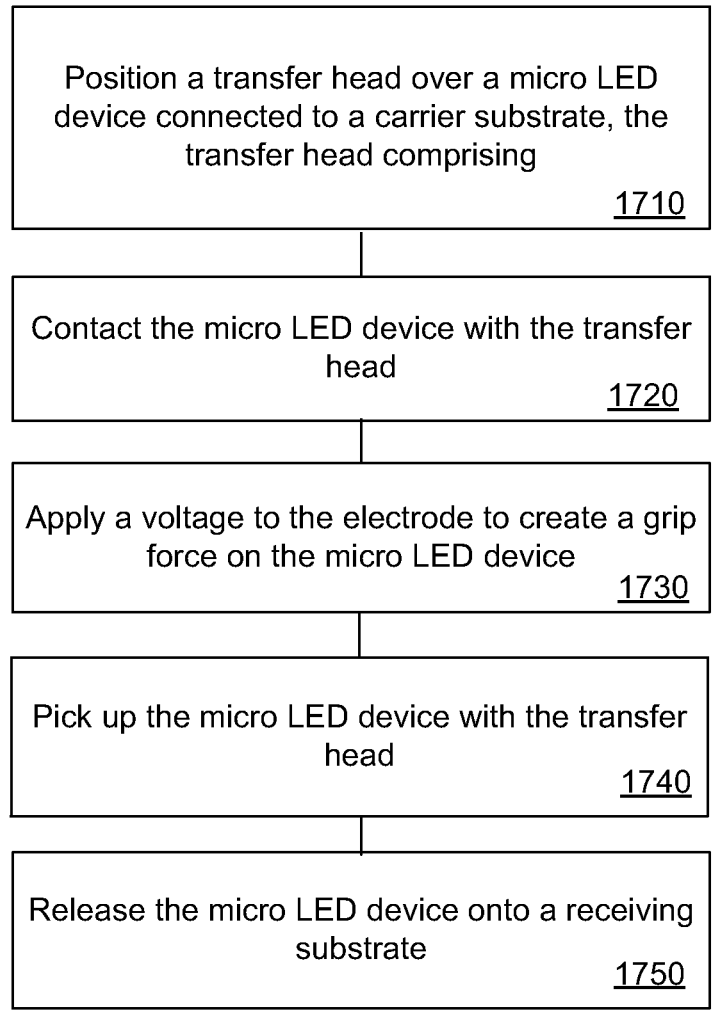
FIG. 17 is a flow chart illustrating a method of picking up and transferring a micro LED device from a carrier substrate to a receiving substrate in accordance with an embodiment of the invention.

FIG. 17 is a flow chart illustrating a method of picking up and transferring a micro LED device from a carrier substrate to a receiving substrate in accordance with an embodiment of the invention. At operation 1710 a transfer head is positioned over a micro LED device connected to a carrier substrate. The transfer head may comprise a mesa structure, an electrode over the mesa structure, and a dielectric layer covering the electrode as described in the above embodiments. The micro LED device is then contacted with the transfer head at operation 1720. In an embodiment, the micro LED device is contacted with the dielectric layer 320 of the transfer head. In an alternative embodiment, the transfer head is positioned over the micro LED device with a suitable air gap separating them which does not significantly affect the grip pressure, for example, 1 nm (0.001 μm) or 10 nm (0.01 μm). At operation 1730 a voltage is applied to the electrode to create a grip pressure on the micro LED device, and the micro LED device is picked up with the transfer head at operation 1740. The micro LED device is then released onto a receiving substrate at operation 1750.

While operations 2110-2150 have been illustrated sequentially in FIG. 17, it is to be appreciated that embodiments are not so limited and that additional operations may be performed and certain operations may be performed in a different sequence. For example, in one embodiment, after contacting the micro LED device with the transfer head, the transfer head is rubbed across a top surface of the micro LED device in order to dislodge any particles which may be present on the contacting surface of either of the transfer head or micro LED device. In another embodiment, an operation is performed to create a phase change in the bonding layer connecting the micro LED device to the carrier substrate prior to or while picking up the micro device. If a portion of the bonding layer is picked up with the micro LED device, additional operations can be performed to control the phase of the portion of the bonding layer during subsequent processing.

Operation 1730 of applying the voltage to the electrode to create a grip pressure on the micro LED device can be performed in various orders. For example, the voltage can be applied prior to contacting the micro LED device with the transfer head, while contacting the micro LED device with the transfer head, or after contacting the micro LED device with the transfer head. The voltage may also be applied prior to, while, or after creating the phase change in the bonding layer.

Where the transfer head includes a bipolar electrode, an alternating voltage is applied across the pair of electrodes 316A, 316B so that at a particular point in time when a negative voltage is applied to electrode 316A, a positive voltage is applied to electrode 316B, and vice versa in order to create the pick up pressure. Releasing the micro LED device from the transfer head may be accomplished with a variety of methods including turning off the voltage sources, lowering the voltage across the pair of electrodes, changing a waveform of the AC voltage, and grounding the voltage source.

Figure 18:
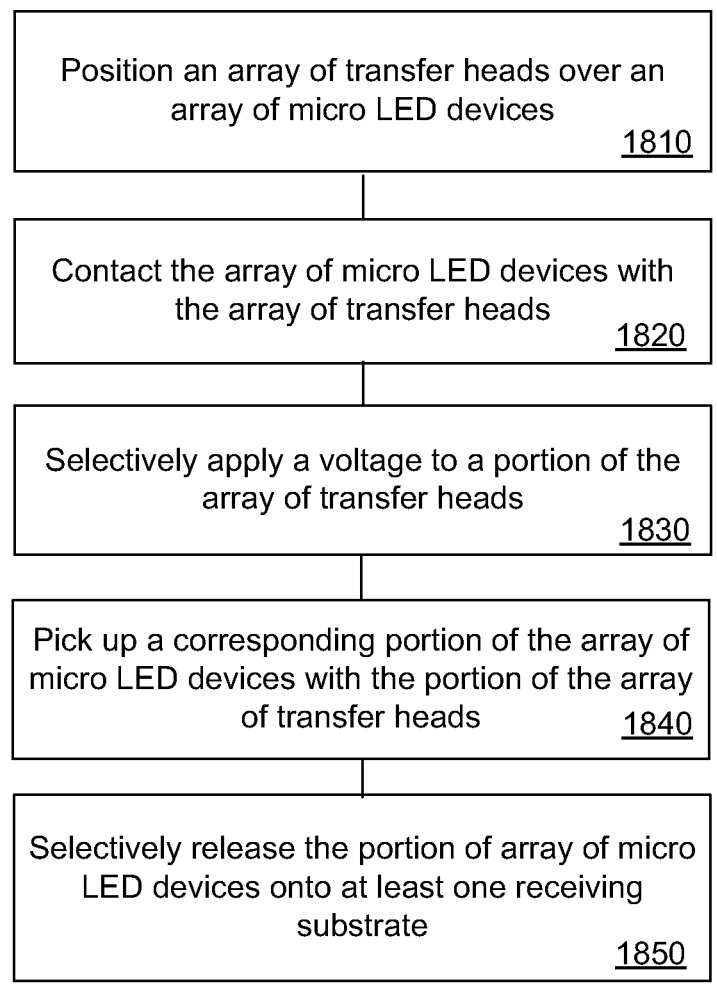
FIG. 18 is a flow chart illustrating a method of picking up and transferring an array of micro LED devices from a carrier substrate to a receiving substrate in accordance with an embodiment of the invention.
Figure 19:
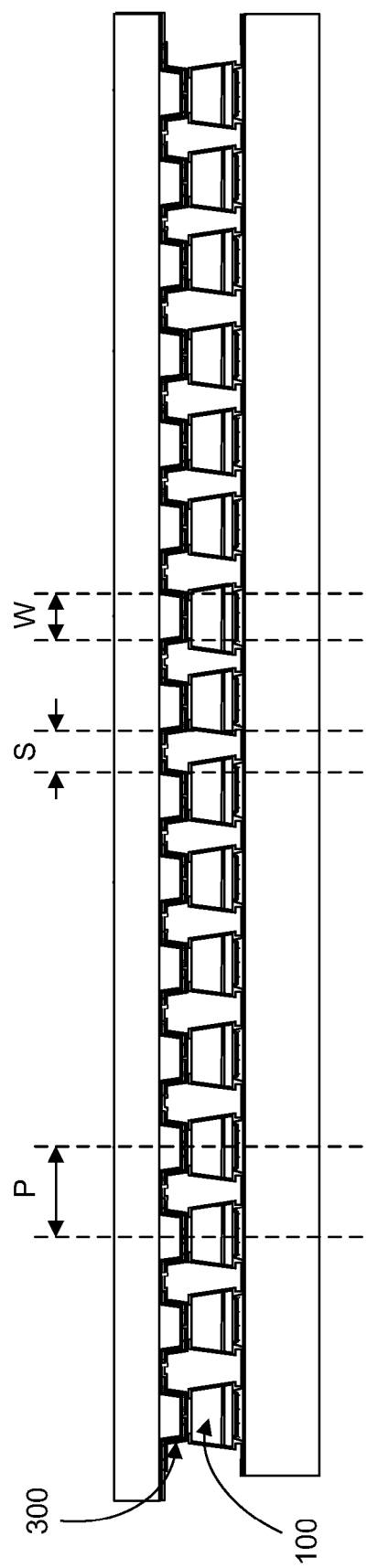
FIG. 19 is a cross-sectional side view illustration of an array of micro device transfer heads in contact with an array of micro LED devices in accordance with an embodiment of the invention.

FIG. 18 is a flow chart illustrating a method of picking up and transferring an array of micro LED devices from a carrier substrate to at least one receiving substrate in accordance with an embodiment of the invention. At operation 1810 an array of transfer heads is positioned over an array of micro LED devices, with each transfer head having a mesa structure, an electrode over the mesa structure, and a dielectric layer covering the electrode. At operation 1820 the array of micro LED devices are contacted with the array of transfer heads. In an alternative embodiment, the array of transfer heads is positioned over the array of micro LED devices with a suitable air gap separating them which does not significantly affect the grip pressure, for example, 1 nm (0.001 μm) or 10 nm (0.01 μm). FIG. 19 is a side view illustration of an array of micro device transfer heads 300 in contact with an array of micro LED devices 100 in accordance with an embodiment of the invention. As illustrated in FIG. 19, the pitch (P) of the array of transfer heads 300 matches the pitch of the micro LED devices 100, with the pitch (P) of the array of transfer heads being the sum of the spacing (S) between transfer heads and width (W) of a transfer head.

In one embodiment, the array of micro LED devices 100 have a pitch of 10 μm, with each micro LED device having a spacing of 2 μm and a maximum width of 8 μm. In an exemplary embodiment, assuming a micro p-n diode 150 with straight sidewalls the top surface of the each micro LED device 100 has a width of approximately 8 μm. In such an exemplary embodiment, the width of the top surface 321 (see FIG. 16) of a corresponding transfer head 300 is approximately 8 µm or smaller so as to avoid making inadvertent contact with an adjacent micro LED device. In another embodiment, the array of micro LED devices 100 may have a pitch of 5 µm, with each micro LED device having a spacing of 2 µm and a maximum width of 3 µm. In an exemplary embodiment, the top surface of the each micro LED device 100 has a width of approximately 3 µm. In such an exemplary embodiment, the width of the top surface 321 of a corresponding transfer head 300 is approximately 3 µm or smaller so as to avoid making inadvertent contact with an adjacent micro LED device 100. However, embodiments of the invention are not limited to these specific dimensions, and may be any suitable dimension. For example, the top surface 321 of the transfer head 300 may be slightly larger than the tops surface of the micro LED device 100, and smaller than the pitch (P) of the micro LED array described with regard to FIGS. 12A-12B.

Figure 20:
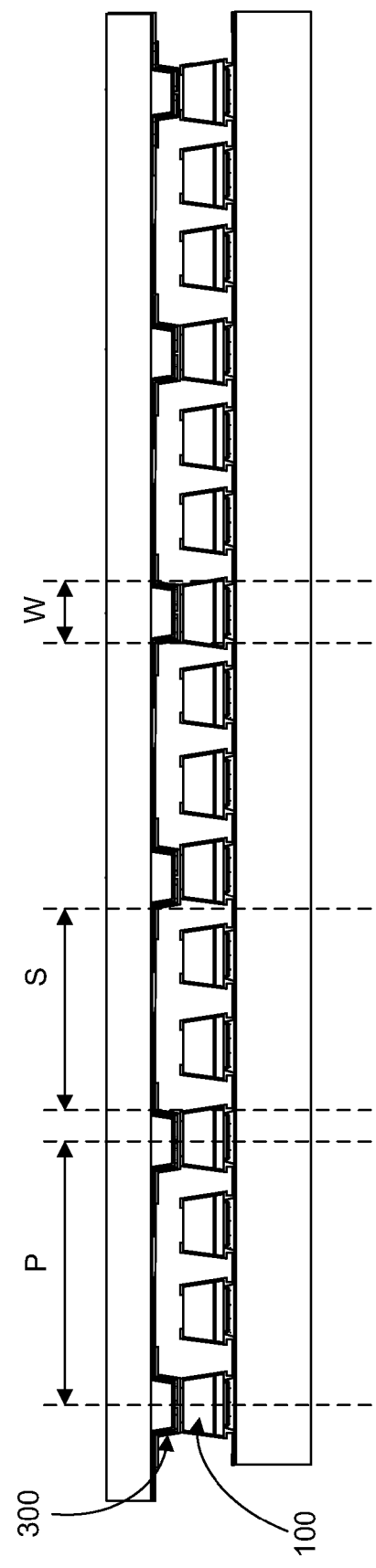
FIG. 20 is a cross-sectional side view illustration of an array of micro device transfer heads in contact with an array of micro LED devices in accordance with an embodiment of the invention.

FIG. 20 is a side view illustration of an array of micro device transfer heads in contact with an array of micro LED devices 100 in accordance with an embodiment of the invention. In the embodiment illustrated in FIG. 20, the pitch (P) of the transfer heads is an integer multiple of the pitch of the array of micro devices. In the particular embodiment illustrated, the pitch (P) of the transfer heads is 3 times the pitch of the array of micro LED devices. In such an embodiment, having a larger transfer head pitch may protect against arcing between transfer heads.

Referring again to FIG. 18, at operation 1830 a voltage is selectively applied to a portion of the array of transfer heads 100. Each transfer head 300 may be independently operated, or each transfer head 300 may be operated together. At operation 1840 a corresponding portion of the array of micro devices is picked up with the portion of the array of transfer heads to which the voltage was selectively applied. In one embodiment, selectively applying a voltage to a portion of the array of transfer heads means applying a voltage to every transfer head in the array of transfer heads. FIG. 21A is a side view illustration of every transfer head in an array of micro device transfer heads picking up an array of micro LED devices 100 in accordance with an embodiment of the invention. In another embodiment, selectively applying a voltage to a portion of the array of transfer heads means applying a voltage to less than every transfer head (e.g. a subset of transfer heads) in the array of transfer heads. FIG. 21B is a side view illustration of a subset of the array of micro device transfer heads picking up a portion of an array of micro LED devices 100 in accordance with an embodiment of the invention. In a particular embodiment illustrated in FIGS. 21A-21B the pick up operation includes picking up the micro p-n diode 150, the reflective metallization stack 120, and a portion of the conformal dielectric barrier layer 160 for the micro LED device 100. In a particular embodiment illustrated in FIGS. 21A-21B, the pick up operation includes picking up a substantial portion of the bonding layer 210. Accordingly, any of the embodiments described with regard to FIGS. 17-23B may also be accompanied by controlling the temperature of the portion of the bonding layer 210. For example, embodiments described with regard to FIGS. 17-23B may include performing an operation to create a phase change from solid to liquid state in a plurality of locations of the bonding layer connecting the array of micro LED devices to the carrier substrate 201 prior to picking up the array of micro LED devices. In an embodiment, the plurality of locations of the bonding layer can be regions of the same bonding layer. In an embodiment, the plurality of locations of the bonding layer can be laterally separate locations of the bonding layer.

At operation 1850 the portion of the array of micro LED devices is then released onto at least one receiving substrate.

Thus, the array of micro LED devices can all be released onto a single receiving substrate, or selectively released onto multiple substrates. For example, the receiving substrate may be, but is not limited to, a display substrate, a lighting substrate, a substrate with functional devices such as transistors or ICs, or a substrate with metal redistribution lines. Release may be accomplished by affecting the applied voltage as previously described.

In accordance with some embodiments, release may also be accompanied by alloy bonding the bonding layer 210 with an electrically conductive receiving bonding layer to form a permanent alloy bonding layer. In certain embodiments, a substantial portion of the bonding layer 210 is released onto the receiving substrate with a corresponding micro LED device. In such embodiments, a substantial portion may corresponding to a sufficient amount of bonding layer to alter the liquidus temperature of the electrically conductive receiving bonding layer when forming the permanent alloy bonding layer. In other embodiments, a substantial portion may correspond to a significant quantity which can affect bonding to the receiving substrate.

Figure 22:
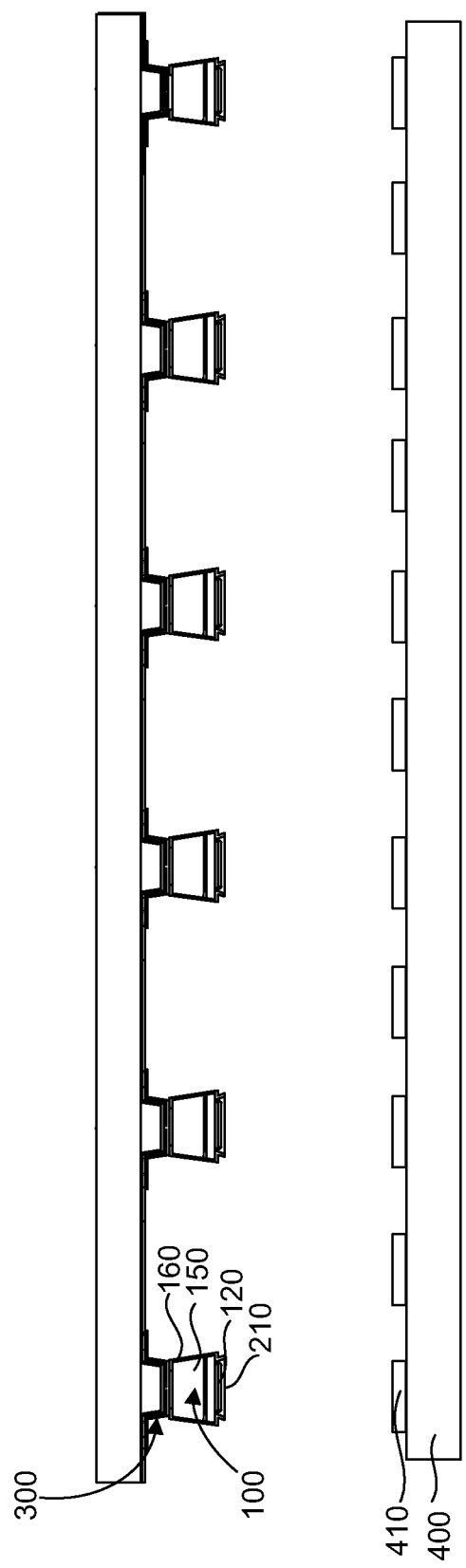
FIG. 22 is a cross-sectional side view illustration of an array of micro device transfer heads with an array of micro LED devices positioned over a receiving substrate in accordance with an embodiment of the invention.
Figure 23A:
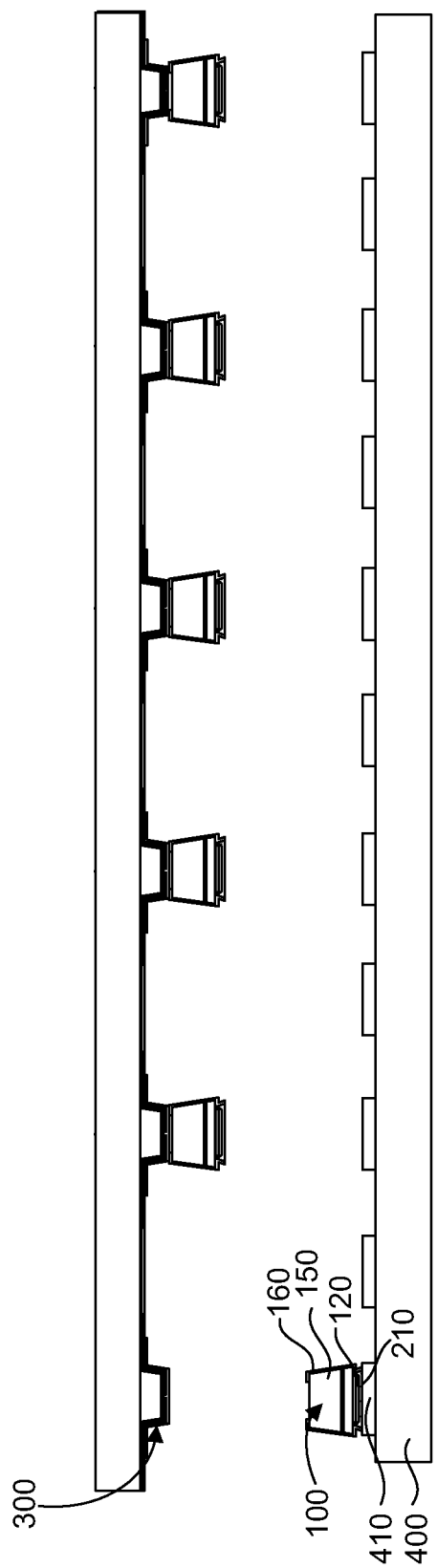
FIG. 23A is a cross-sectional side view illustration of a micro LED device selectively released onto a receiving substrate in accordance with an embodiment of the invention.
Figure 23B:
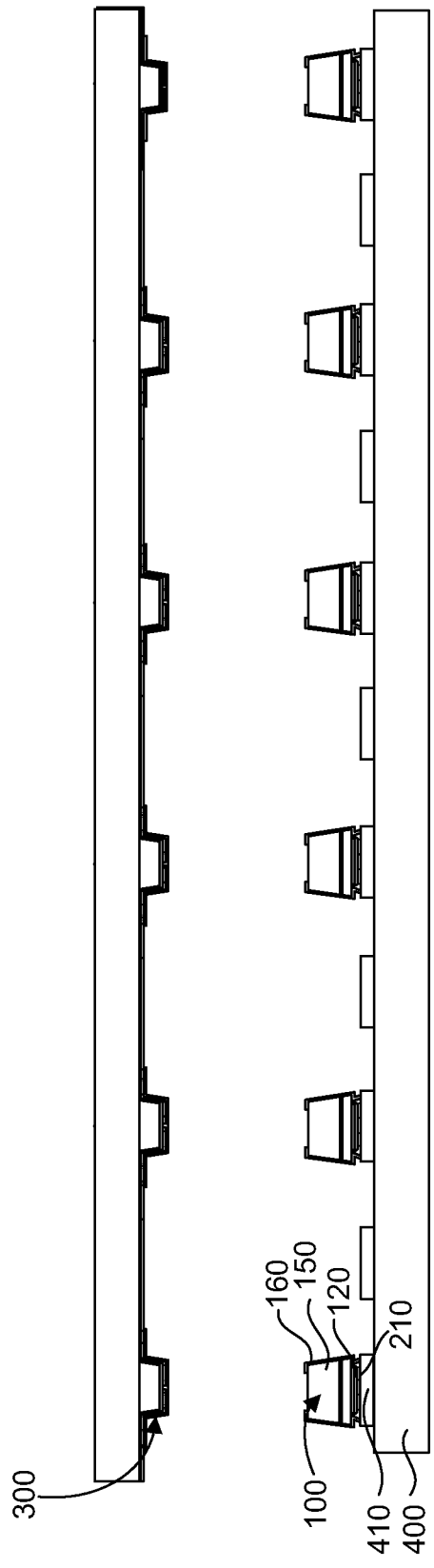
FIG. 23B is a cross-sectional side view illustration of an array of micro LED devices released onto a receiving substrate in accordance with an embodiment of the invention.

FIG. 22 is a side view illustration of an array of micro device transfer heads holding a corresponding array of micro LED devices 100 over a receiving substrate 400 including a plurality of driver contacts 410. The array of micro LED devices 100 may then be placed into contact with the receiving substrate and then selectively released. FIG. 23A is a side view illustration of a single micro LED device 100 selectively released onto the receiving substrate 400 over a driver contact 410 in accordance with an embodiment of the invention. FIG. 23B is a side view illustration of a all micro LED devices 100 selectively released onto the receiving substrate 400 over a driver contact 410 in accordance with an embodiment of the invention.

In utilizing the various aspects of this invention, it would become apparent to one skilled in the art that combinations or variations of the above embodiments are possible for forming an array of micro LED devices which are poised for pick up and transfer to a receiving substrate. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a micro LED array comprising:
   forming a plurality of laterally separate self-aligned metallization stacks within a corresponding plurality of openings in a patterned sacrificial layer formed on a p-n diode layer;
   bonding a first substrate stack including the plurality of laterally separate self-aligned metallization stacks, the patterned sacrificial layer, and the p-n diode layer to a second substrate with a bonding layer;
   etching through the p-n diode layer to form a plurality of micro p-n diodes over the plurality of separate metallization stacks, and exposing the patterned sacrificial layer laterally between the plurality of separate metallization stacks; and
   removing the patterned sacrificial layer.

2. The method of claim 1, wherein forming the plurality of laterally separate self-aligned metallization stacks within the corresponding plurality of openings in the patterned sacrificial layer formed on the p-n diode layer comprises:
   depositing a sacrificial layer over the p-n diode layer;

forming a patterned mask layer over the sacrificial layer, the patterned mask layer including the plurality of openings exposing the sacrificial layer;

selectively etching the sacrificial layer relative to the mask layer to remove the exposed sacrificial layer within the plurality of openings and to remove a portion of the sacrificial layer underneath the patterned mask layer;

depositing a metallization stack layer over the patterned mask layer and p-n diode layer;

lifting off the patterned mask layer to leave behind the plurality of metallization stacks and the patterned sacrificial layer over the p-n diode layer.

3. The method of claim 1, wherein etching through the p-n diode layer comprises plasma etching.

4. The method of claim 1, wherein the plurality of self-aligned metallization stacks include an electrode layer and a barrier layer.

5. The method of claim 4, wherein the barrier layer covers an elevated surface and sidewalls of the electrode layer.

6. The method of claim 5, wherein the electrode layer is reflective.

7. The method of claim 6, wherein the electrode layer comprises a material selected from the group consisting of silver and nickel.

8. The method of claim 5, wherein forming the plurality of laterally separate self-aligned metallization stacks comprises depositing the barrier layer at a higher power than the electrode layer, or at a lower pressure than the electrode layer.

9. The method of claim 1, wherein the patterned sacrificial layer is a non-metallic layer.

10. The method of claim 9, wherein the patterned sacrificial layer comprises $SiO_2$.

11. The method of claim 4, wherein the patterned sacrificial layer is thicker than the plurality of laterally separate self-aligned metallization stacks.

12. The method of claim 11, wherein the patterned sacrificial layer is approximately twice as thick as the plurality of laterally separate self-aligned metallization stacks.

13. The method of claim 4, wherein forming the plurality of self-aligned metallization stacks comprises a technique selected from the group consisting of evaporation and sputtering.

14. The method of claim 1, further comprising depositing a conformal dielectric barrier layer on side surfaces and a portion of a bottom surface of each of the plurality of micro p-n diodes.

15. The method of claim 1, wherein the bonding layer has a liquidus temperature of approximately 350° C. or lower.

16. The method of claim 15, wherein the bonding layer has a liquidus temperature of approximately 200° C. or lower.

17. The method of claim 15, wherein the bonding layer comprises indium.

18. The method of claim 15, wherein bonding the first substrate stack to the second substrate with the bonding layer comprises bonding a first bonding layer on the first substrate stack with a second bonding layer on the second substrate.

19. The method of claim 18, wherein bonding comprises alloy bonding or fusion bonding the first and second bonding layers.

20. A method of forming a micro LED array comprising:
depositing a sacrificial layer over a p-n diode layer; and
forming a patterned mask layer over the sacrificial layer, the patterned mask layer including a plurality of openings exposing the sacrificial layer;

forming a patterned sacrificial layer, wherein forming the patterned sacrificial layer includes selectively etching the sacrificial layer relative to the mask layer to remove the exposed sacrificial layer within the plurality of openings and to remove a portion of the sacrificial layer underneath the patterned mask layer;

depositing a metallization stack layer over the patterned mask layer and p-n diode layer;

lifting off the patterned mask layer to leave behind a plurality of metallization stacks and the patterned sacrificial layer over the p-n diode layer, wherein the patterned sacrificial layer is thicker than the plurality of metallization stacks;

bonding a first substrate stack including the plurality of metallization stacks, the patterned sacrificial layer and the p-n diode layer to a second substrate with a bonding layer;

plasma etching through the p-n diode layer to form a plurality of micro p-n diodes over the plurality of separate metallization stacks, and exposing the patterned sacrificial layer laterally between the plurality of separate metallization stacks; and removing the patterned sacrificial layer.

21. A method of forming a micro LED array comprising:
depositing a sacrificial layer over a p-n diode layer formed on a growth substrate; and forming a patterned mask layer over the sacrificial layer, the patterned mask layer including a plurality of openings exposing the sacrificial layer;

forming a patterned sacrificial layer, wherein forming the patterned sacrificial layer includes selectively etching the sacrificial layer relative to the mask layer to remove the exposed sacrificial layer within the plurality of openings and to remove a portion of the sacrificial layer underneath the patterned mask layer;

depositing a metallization stack layer over the patterned mask layer and p-n diode layer;

lifting off the patterned mask layer to leave behind a plurality of metallization stacks and the patterned sacrificial layer over the p-n diode layer, wherein the patterned sacrificial layer is thicker than the plurality of metallization stacks.

22. The method of claim 21, wherein the plurality of self-aligned metallization stacks each include an electrode layer and a barrier layer covering an elevated surface and sidewalls of the electrode layer.

23. The method of claim 22, wherein the electrode layer is reflective.

24. The method of claim 23, wherein the electrode layer comprises a material selected from the group consisting of silver and nickel.

25. The method of claim 22, wherein forming the plurality of laterally separate self-aligned metallization stacks comprises depositing the barrier layer at a higher power than the electrode layer, or at a lower pressure than the electrode layer.

26. The method of claim 22, further comprising:
bonding a first substrate stack including the plurality of metallization stacks, the p-n diode layer, and the growth substrate to a second substrate with a bonding layer; and
removing the growth substrate.

* * * * *